(12) United States Patent
Imahori

(10) Patent No.: US 11,784,283 B2
(45) Date of Patent: Oct. 10, 2023

(54) LIGHT EMITTING DEVICE WITH REFLECTIVE SHEET HAVING APERTURES

(71) Applicant: Funai Electric Co., Ltd., Osaka (JP)

(72) Inventor: Yoshimasa Imahori, Osaka (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 138 days.

(21) Appl. No.: 17/333,669

(22) Filed: May 28, 2021

(65) Prior Publication Data

US 2021/0384377 A1     Dec. 9, 2021

(30) Foreign Application Priority Data

Jun. 5, 2020  (JP) ................................ 2020-098847

(51) Int. Cl.
*H01L 33/10*   (2010.01)
*H01L 27/15*   (2006.01)
(Continued)

(52) U.S. Cl.
CPC ........ *H01L 33/10* (2013.01); *G02F 1/133603* (2013.01); *G02F 1/133605* (2013.01);
(Continued)

(58) Field of Classification Search
CPC ..... H01L 33/10; H01L 33/60; H01L 25/0753; H01L 27/156; G02F 1/133606; G02F 1/133611
See application file for complete search history.

(56) References Cited

U.S. PATENT DOCUMENTS

2011/0292316 A1*  12/2011  Fujimoto .......... G02F 1/133605
                                                        349/58
2019/0094618 A1*   3/2019  Kyoukane ............... H01L 33/58
(Continued)

FOREIGN PATENT DOCUMENTS

JP       2011-181219 A       9/2011
JP        2011181219 A   *   9/2011

OTHER PUBLICATIONS

Kiyoshi, Light Source, Surface Light Source Module, and Method of Manufacturing the Light Source, 2011, JP2011181219A, https://worldwide.espacenet.com/patent/search/family/044692549/publication/JP2011181219A (Year: 2011).*

(Continued)

*Primary Examiner* — Tracie Y Green
*Assistant Examiner* — Michael Chiang
(74) *Attorney, Agent, or Firm* — Global IP Counselors, LLP

(57) ABSTRACT

A light emitting device comprises a substrate a plurality of light emitting elements provided on the substrate, and a reflective sheet provided to be positioned at a predetermined reference position on the substrate and having a plurality of apertures that expose the light emitting elements therethrough, respectively. The apertures are configured such that a first spacing that is located between each of the apertures and a respective one of the light emitting elements and farther than the respective one of the light emitting elements from the reference position is larger than a second spacing that is located between each of the apertures and the respective one of the light emitting elements and closer than the respective one of the light emitting elements to the reference position.

20 Claims, 11 Drawing Sheets

(51) Int. Cl.
*G02F 1/13357* (2006.01)
*H01L 33/60* (2010.01)
*H01L 25/075* (2006.01)

(52) U.S. Cl.
CPC .. *G02F 1/133606* (2013.01); *G02F 1/133611* (2013.01); *H01L 25/0753* (2013.01); *H01L 27/156* (2013.01); *H01L 33/60* (2013.01)

(56) References Cited

U.S. PATENT DOCUMENTS

| | | | |
|---|---|---|---|
| 2019/0310516 A1* | 10/2019 | Kyoukane | G02F 1/133603 |
| 2020/0019017 A1* | 1/2020 | Kyoukane | G02F 1/133611 |

OTHER PUBLICATIONS

The extended European search report for the corresponding European application No. 21177165.4, dated Nov. 9, 2021.

* cited by examiner (COMPARATIVE EXAMPLE)
START OF USE

AFTER LONG-TERM USE (THIRD EMBODIMENT)
START OF USE

AFTER LONG-TERM USE

LIGHT EMITTING DEVICE WITH REFLECTIVE SHEET HAVING APERTURES

CROSS-REFERENCE TO RELATED APPLICATIONS

This application claims priority to Japanese Patent Application No. 2020-098847 filed on Jun. 5, 2020. The entire disclosure of Japanese Patent Application No. 2020-098847 is hereby incorporated herein by reference.

BACKGROUND

Field of the Invention

This invention generally relates to a light emitting device. More specifically, the present invention relates to a light emitting device equipped with a substrate, a plurality of light emitting elements and a reflective sheet.

Background Information

Some light emitting devices are equipped with a substrate, a plurality of light emitting elements, and a reflective sheet (see Japanese Laid-Open Patent Application Publication No. 2011-181219 (Patent Literature 1), for example).

The light emitting device described in Patent Literature 1 above uses a reflective sheet with a plurality of apertures formed at positions of the light emitting elements. As a material of the reflective sheet, polyethylene terephthalate (PET) is used.

SUMMARY

In a light emitting device equipped with a substrate, a plurality of light emitting elements provided on the substrate and a reflective sheet having a plurality of apertures that are formed at positions of the light emitting elements, although not described in Patent Literature 1 above, variations in the attachment position can occur when the substrate and the reflective sheet are attached relative to each other. In addition, the difference in linear expansion coefficients due to the different materials between the substrate and the reflective sheet causes relative positional shift between the substrate and the apertures of the reflective sheet due to temperature changes. The positional shift caused by the temperature changes (the linear expansion coefficient difference) can cause contact between the peripheral edges of the apertures of the reflective sheet and the light emitting elements. The contact between the peripheral edges of the apertures and the light emitting elements may cause an unintended force to act on the light emitting elements, or depending on the positional shift, the light emitting elements may be covered by the reflective sheet. In order to prevent these inconveniences caused by the positional shift due to temperature changes (the linear expansion coefficient difference), the aperture area of the apertures of the reflective sheet is designed to be larger than the outer periphery of the light emitting elements. In addition, since the expansion amount and the contraction amount of the reflective sheet due to temperature changes are approximately equal to each other, the apertures are generally formed such that the light emitting elements are disposed in the center of the apertures in plan view.

Here, a general light emitting device uses a resin material such as polyethylene terephthalate as a material for the reflective sheet. As a result of the inventor's intensive study of the reflective sheet, it has been discovered that when such a resin sheet is used for a long period of time in a high temperature environment, it shrinks and crystallizes, and irreversible heat shrinkage occurs in which the shrinkage does not return to its original state even when the temperature is lowered. This heat shrinkage is a phenomenon that occurs separately from the contraction caused by linear thermal expansion. The irreversible shrinkage of the reflective sheet due to heating causes variations in the spacing between the peripheral edges of the apertures and the outer peripheries of the light emitting elements. This changes the relative position between the light emitting elements and the apertures of the reflective sheet due to the irreversible heat shrinkage of the reflective sheet, and changes the reflective sheet placement distribution around the light emitting elements. As a result, compared to the luminance distribution at the optimized relative position at start of use of the light emitting device, the luminance distribution after long-term use will change and the luminance uniformity will decrease.

Patent Literature 1 above describes the use of polyethylene terephthalate as the material of the reflective sheet, but it does not give any consideration to the irreversible shrinkage of the reflective sheet due to heating after the start of use of the light emitting device. In other words, the problem of a decrease in luminance uniformity due to a change in the relative position between the light emitting elements and the apertures of the reflective sheet caused by irreversible heat shrinkage of the reflective sheet after long-term use of the light emitting device has not been solved. Therefore, in Patent Literature 1 above, it is difficult to suppress the decrease in luminance uniformity due to the change in the relative position between the light emitting elements and the apertures of the reflective sheet caused by the irreversible heat shrinkage of the reflective sheet, while suppressing an inconvenience caused by the difference in the linear expansion coefficients between the substrate and the reflective sheet.

One object of the present disclosure is to provide a light emitting device that can suppress a decrease in luminance uniformity due to a change in a relative position between light emitting elements and apertures of a reflective sheet caused by irreversible heat shrinkage of the reflective sheet after long-term use of the light emitting device, while suppressing an inconvenience caused by a difference in linear expansion coefficients between a substrate and the reflective sheet.

In view of the state of the known technology and in accordance with one aspect of the present invention, a light emitting device comprises a substrate, a plurality of light emitting elements provided on the substrate, and a reflective sheet provided to be positioned at a predetermined reference position on the substrate and having a plurality of apertures that expose the light emitting elements therethrough, respectively. The apertures are configured such that a first spacing that is located between each of the apertures and a respective one of the light emitting elements and farther than the respective one of the light emitting elements from the reference position is larger than a second spacing that is located between each of the apertures and the respective one of the light emitting elements and closer than the respective one of the light emitting elements to the reference position. For example, the first spacing can be disposed between each of the apertures and the respective one of the light emitting elements and disposed in an opposite direction, which is opposite to an approaching direction approaching the reference position, relative to the respective one of the light emitting elements, while the second spacing can be disposed between each of the apertures and the respective one of the light emitting elements and disposed in the approaching direction approaching the reference position relative to the respective one of the light emitting elements.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents. In the illustrated embodiment, the left-right direction as viewed from a front side of a display device including a light emitting device is described as an X direction. The up-down direction as viewed from the front side of the display device is described as a Y direction. The direction connecting a back side and the front side of the display device is described as a Z direction.

First Embodiment (Configuration of Light Emitting Device)

Figure 1:
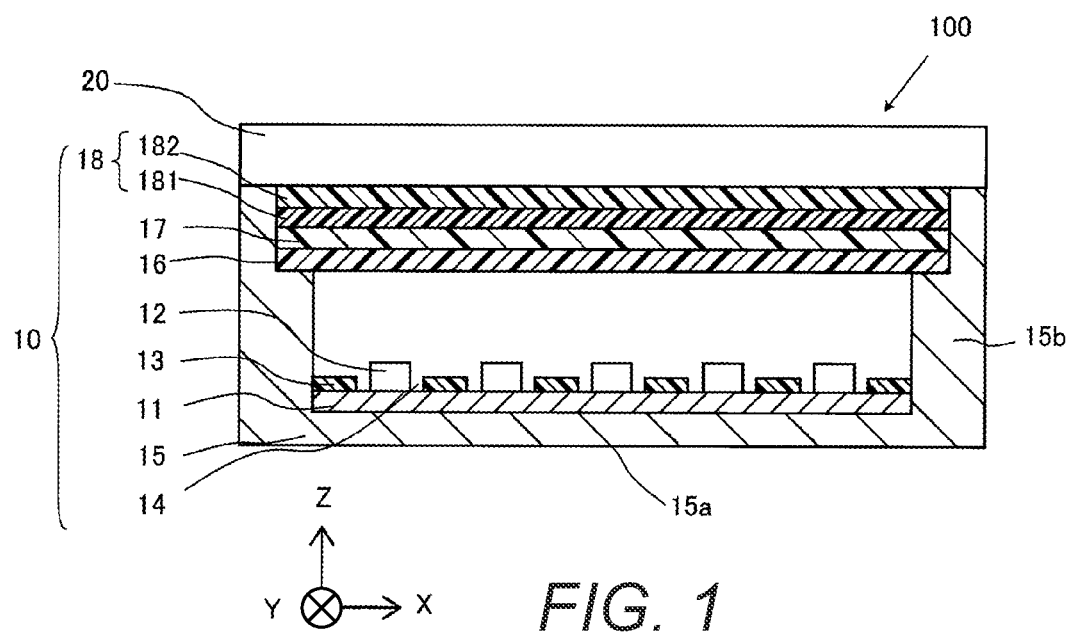
FIG. 1 is a cross-sectional view of a display device including a light emitting device according to a first embodiment.
Figure 2:
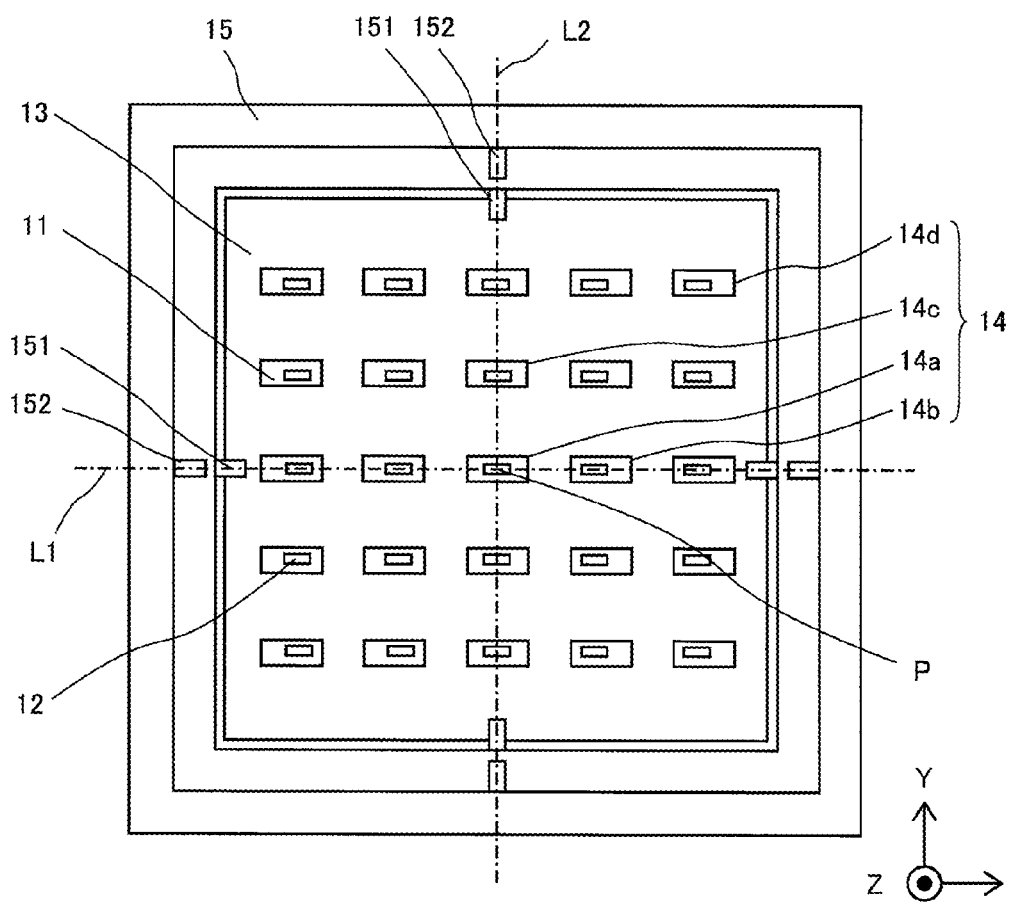
FIG. 2 is a front view of the light emitting device according to the first embodiment.
Figure 3:
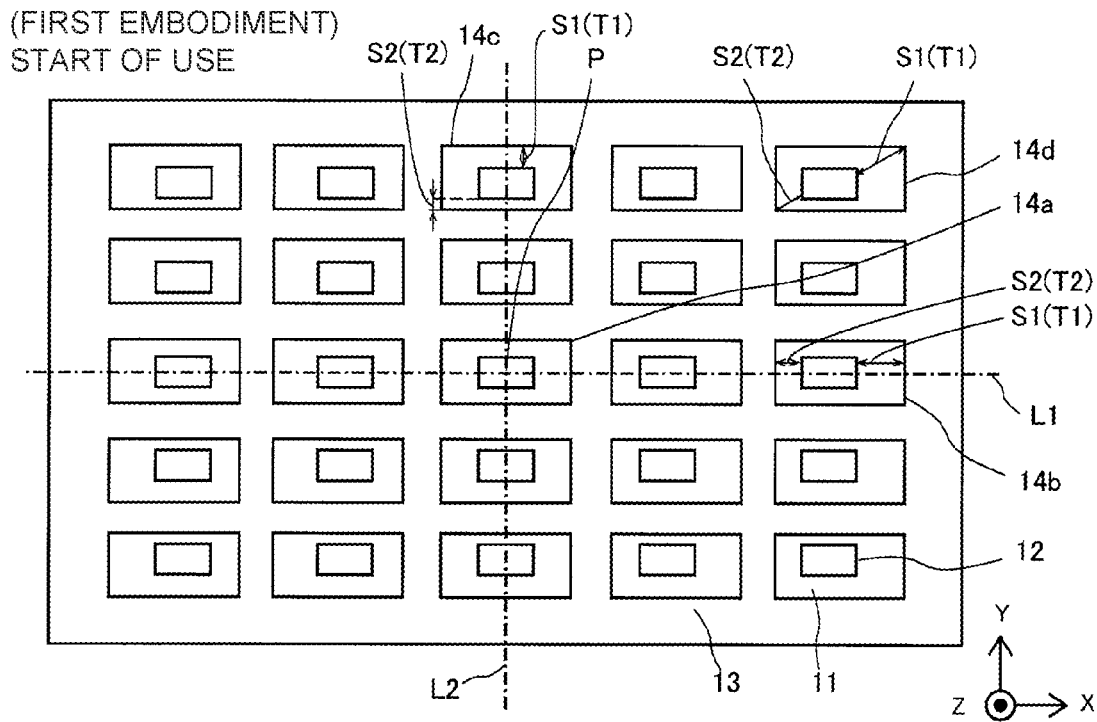
FIG. 3 is a planar schematic diagram showing a positional relationship between a substrate, a plurality of light emitting elements and a reflective sheet at start of use of the light emitting device according to the first embodiment.

Referring to FIGS. 1 to 3, the configuration of a display device 100 including a light emitting device 10 according to a first embodiment will be described.

As shown in FIG. 1, the display device 100 has the light emitting device 10 and a display panel 20. The light emitting device 10 is equipped with a substrate 11, a plurality of light emitting elements 12, a reflective sheet 13, a holding member 15, a luminance equalizer sheet (e.g., a luminance uniformity sheet or a homogenizer) 16, a diffusion member 17, and an optical sheet 18. The light emitting device 10 arranges the substrate 11, the reflective sheet 13, the luminance equalizer sheet 16, the diffusion member 17, and the optical sheet 18 inside the holding member 15 in this order. FIG. 1 is a cross-sectional view of the display device 100 including the light emitting device 10 taken along the X direction.

The substrate 11 is a printed wiring board and includes the light emitting elements 12 provided on the front side and a connector (not shown) to which power is supplied from outside. The substrate 11 includes a glass epoxy substrate using FR4 (Flame Retardant 4), a glass composite substrate using CEM3 (Composite Epoxy Material) 3), or a metal substrate, such as aluminum, but is not limited to these.

As shown in FIG. 2, the substrate 11 has a rectangular shape including four sides in plan view. Specifically, the substrate 11 has a pair of sides along the X direction and a pair of sides along the Y direction. The pair of sides along the X direction and the pair of sides along the Y direction of the substrate 11 have notches (not shown), respectively, for engaging with first engagement protrusions 151 that are formed on the holding member 15 as described below. The substrate 11 is positioned in the X direction by the notches formed on the pair of sides along the X direction and the first engagement protrusions 151. The substrate 11 is also positioned in the Y direction by the notches formed on the pair of sides along the Y direction and the first engagement protrusions 151. The term "rectangular shape" in the present disclosure is a concept that includes both a square shape and a rectangular (non-square) shape.

The light emitting elements 12 are configured to emit light by being energized. The light emitting elements 12 have a rectangular shape in plan view. The light emitting elements 12 include an LED (Light Emitting Diode). In the illustrated embodiment, twenty-five light emitting elements 12 are arranged in a matrix. Specifically, the light emitting elements 12 are arranged in five rows with five light emitting elements 12 in each row. However, the number of the light emitting elements 12 can be different from twenty-five, as needed and/or desired.

The reflective sheet 13 is disposed on the substrate 11. The reflective sheet 13 has a plurality of apertures 14 that expose the light emitting elements 12 and their vicinities therethrough, respectively. The reflective sheet 13 is fixed to a surface of the substrate 11 on which the light emitting elements 12 are mounted so as to avoid the light emitting elements 12 by the apertures 14. The reflective sheet 13 is fixed to the substrate 11 by fixing means such as double-sided tape. The reflective sheet 13 is made of polyethylene terephthalate, for example, in consideration of its reflective properties. The material of the reflective sheet 13 is not limited to polyethylene terephthalate, but may also be a resin film such as acrylic or polypropylene. The reflective sheet 13 increases the light utilization efficiency by re-reflecting light Li30 (see FIG. 6) that has been reflected by the luminance equalizer sheet 16, the diffusion member 17 and the optical sheet 18 and returned to the substrate 11, and also makes the luminance distribution uniform by allowing the light to travel from areas other than the light emitting elements 12 toward a light emitting surface or front surface of the light emitting device 10.

The reflective sheet 13 has a rectangular shape including four sides in plan view. Specifically, the reflective sheet 13 has a pair of sides along the X direction and a pair of sides along the Y direction. The pair of sides of the reflective sheet 13 along the X direction of the reflective sheet 13 have notches (not shown), respectively, that form first positioning portions, respectively, for engaging with the first engagement protrusions 151 that are formed on the holding member 15, as described below. The pair of sides of the reflective sheet 13 along the Y direction have notches (not shown), respectively, that form second positioning portions, respectively, for engaging with the first engagement protrusions 151 that are formed on the holding member 15, as described later. The reflective sheet 13 is positioned in the X direction by the notches formed on the pair of sides along the X direction and the first engagement protrusions 151. The reflective sheet 13 is also positioned in the Y direction by the notches formed on the sides along the Y direction and the first engagement protrusions 151. The reflective sheet 13 is provided relative to the substrate 11 to be positioned at a reference position P (e.g., a predetermined reference position). The reference position P is located at an intersection of a straight line L1 (e.g., a first reference line) connecting the pair of notches formed on the pair of sides of the reflective sheet 13 along the Y direction and a straight line L2 (e.g., a second reference line) connecting the pair of notches formed on the pair of sides of the reflective sheet 13 along the X direction.

The apertures 14 are arranged in a matrix around the reference position P in plan view. In the illustrated embodiment, as shown in FIG. 2, twenty-five apertures 14 are arranged in five rows with five apertures 14 in each row. However, the number of the apertures 14 can be different from twenty-five, as needed and/or desired. The apertures 14 includes a reference aperture 14a, a plurality of first apertures 14b, a plurality of second apertures 14c, and a plurality of third apertures 14d. The reference aperture 14a is arranged to include the intersection of the straight lines L1 and L2, which is the reference position P, therewithin. Specifically, as shown in FIG. 2, the reference position P is located at the center of the reference aperture 14a. The first apertures 14b are arranged relative to each other on the straight line L1 (e.g., the first reference line). In the illustrated embodiment, the straight line L1 extends in a direction substantially parallel to the pair of sides of the reflective sheet 13 along the X direction and passes through the reference position P. The second apertures 14c are arranged relative to each other on the straight line L2 (e.g., the second reference line). In the illustrated embodiment, the straight line L2 extends in a direction substantially parallel to the pair of sides of the reflective sheet 13 along the Y direction and passes through the reference position P. The third apertures 14d are arranged in areas other than an area on the straight line L1 (e.g., the first reference line) and an area on the straight line L2 (e.g., the second reference line). In other words, the third apertures 14d are arranged in areas that do not overlap with the straight lines L1 and L2. The apertures 14 have a rectangular shape. Thus, the reference aperture 14a, the first apertures 14b, the second apertures 14c, and the third apertures 14d each have a pair of long sides and a pair of short sides. The pair of long sides are substantially parallel to the pair of sides of the reflective sheet 13 along the X direction, and the pair of short sides are substantially parallel to the pair of sides of the reflective sheet 13 along the Y direction.

Here, referring to FIGS. 3 and 4, positional relationships between the substrate 11, the light emitting elements 12, and the reflective sheet 13 in this embodiment at the start of use and during long-term use will be described. The substrate 11 and the reflective sheet 13 are fixed relative to each other in a state in which they are relatively positioned via the holding member 15 (see FIG. 2). The substrate 11 and the reflective sheet 13 are arranged relative to each other such that the light emitting elements 12 mounted on the substrate 11 are disposed within the apertures 14, respectively. The light emitting elements 12 and the apertures 14 are spaced apart from each other with a spacing between a peripheral edge of each of the apertures 14 and an outer periphery of a respective one of the light emitting elements 12.

In particular, as shown in FIG. 3, at the start of use of the light emitting device 10, the first apertures 14b, the second apertures 14c, and the third apertures 14d are configured such that a first spacing S1 that is located between each of these apertures 14 and a respective one of the light emitting elements 12 and farther than the respective one of the light emitting elements 12 from the reference position P is larger than a second spacing S2 that is located between each of these apertures 14 and the respective one of the light emitting elements 12 and closer than the respective one of the light emitting elements 12 to the reference position P. In other words, for each pair of the light emitting elements 12 and the apertures 14, the first spacing S1 is disposed between the light emitting element 12 and the aperture 14 and disposed in an opposite direction T1, which is opposite to an approaching direction T2 approaching the reference position P, relative to the light emitting element 12, while the second spacing S2 is disposed between the light emitting element 12 and the aperture 14 and disposed in the approaching direction T2 relative to the light emitting element 12.

More specifically, in the illustrated embodiment, for each pair of the light emitting elements 12 and the apertures 14, the first spacing S1 can be defined as a spacing between the light emitting element 12 and the farthest part of the aperture 14 from the reference position P on a straight line connecting the reference position P and the farthest part of the aperture 14 from the reference position P, while the second spacing S2 can be defined as a spacing between the light emitting element 12 and the nearest part of the aperture 14 from the reference position P on a straight line connecting the reference position P and the nearest part of the aperture 14 from the reference position P. The pair of long sides and the pair of short sides of each of the reference aperture 14a, the first apertures 14b, the second apertures 14c, and the third apertures 14d are substantially parallel to the pair of long sides and the pair of short sides of the light emitting elements 12, respectively. In the illustrated embodiment, the first spacing S1 of each of the apertures 14 is larger than the second spacing S2 of each of the apertures 14 in plan view. Furthermore, the first spacing S1 of each of the apertures 14 is larger than a spacing between each of the apertures 14 and the respective one of the light emitting elements 12 in a direction orthogonal to the approaching direction T2.

Figure 4:
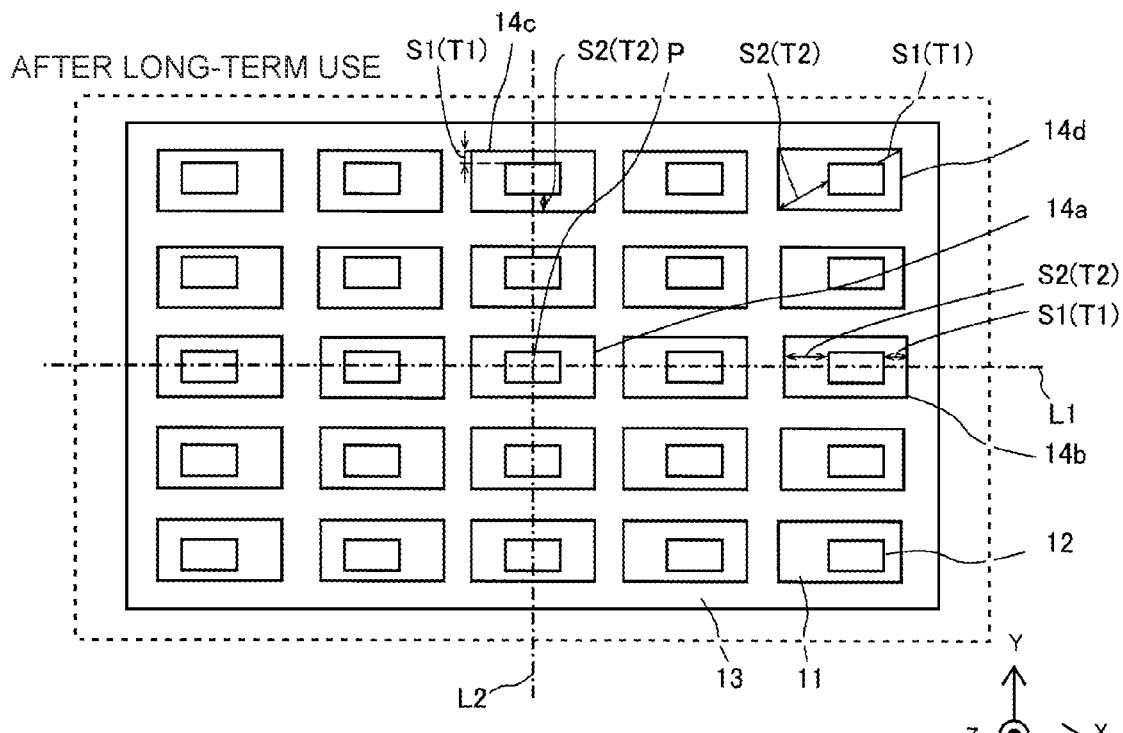
FIG. 4 is a planar schematic diagram showing a positional relationship between the substrate, the light emitting elements and the reflective sheet after long-term use of the light emitting device according to the first embodiment.

As shown in FIG. 4, which will be described in detail later, after long-term use of the light emitting device 10, the first spacing S1 becomes smaller than the second spacing S2 in each of the first apertures 14b, the second apertures 14c, and the third apertures 14d, due to irreversible shrinkage that occurs toward the reference position P and is accumulated over time due to heating of the reflective sheet 13.

The light emitting elements 12 are arranged relative to the apertures 14, respectively, such that the centers of the centers of the light emitting elements 12 are offset relative to the centers of the apertures 14, respectively, except for the reference aperture 14a. Specifically, the apertures 14 are configured such that the light emitting elements 12 located within the apertures 14 are positioned closer to the reference position P than the center of the rectangular shape of the apertures 14 at the start of use of the light emitting device 10, as shown in FIG. 3. In particular, the centers of the light emitting elements 12 located within the apertures 14 are positioned closer to the reference position P than the center of the rectangular shape of the apertures 14 at the start of use of the light emitting device 10, except for the reference aperture 14a. Also, the apertures 14 are configured such that the light emitting elements 12 located within the apertures 14 are positioned farther from the reference position P than the center of the rectangular shape of the apertures 14 after long-term use of the light emitting device 10, as shown in FIG. 4. In particular, the centers of the light emitting elements 12 located within the apertures 14 are positioned farther from the reference position P than the center of the rectangular shape of the apertures 14 after long-term use of the light emitting device 10, except for the reference aperture 14a.

Furthermore, as shown in FIG. 3, at the start of use of the light emitting device 10, each pair of the first apertures 14b and the corresponding light emitting elements 12 has the identical or mirror-symmetrical relative positional relationship. Thus, as shown in FIG. 3, the first apertures 14b have the same first spacing S1. The same is true for the second apertures 14c and the third apertures 14d. However, the first apertures 14b can have different first spacings S1, respectively, as long as the first spacings S1 of the first apertures 14b are larger than the second spacing S2 of the first apertures 14b, respectively, at the start of use of the light emitting device 10. On the other hand, as shown in FIG. 4, after long-term use of the light emitting device 10, depending on positions of the apertures 14, the first apertures 14b can have different first spacings, respectively, the second apertures 14c can have different first spacings, respectively, and the third apertures 14d can have different first spacings, respectively.

The apertures 14 are configured such that the first spacing S1 is dimensioned based on both a reversible expansion and contraction amount caused by expansion and contraction due to a difference in linear expansion coefficients of the substrate 11 and the reflective sheet 13 and a shrinkage amount caused by irreversible shrinkage accumulated over time by heating of the reflective sheet 13. More specifically, in the illustrated embodiment, the first spacing S1 is dimensioned based on a first margin set around the light emitting elements 12 based on the reversible expansion and contraction amount caused by expansion and contraction due to the difference in the linear expansion coefficients of the substrate 11 and the reflective sheet 13, and a second margin set in addition to the first margin based on the shrinkage amount caused by irreversible shrinkage accumulated over time by heating of the reflective sheet 13. On the other hand, the second margin, which is provided based on the shrinkage amount caused by irreversible shrinkage accumulated over time by heating of the reflective sheet 13, is not set for the second spacing S2.

The holding member 15 is a box shape with an opening on the front side, and has a bottom portion 15a and side portions 15b. The substrate 11 is disposed on the bottom portion 15a. The substrate 11 is fixed to the bottom portion 15a using fixing means such as double-sided tape. Since the substrate 11 generates heat, the double-sided tape is selected by considering heat transfer properties. On the front side of the substrate 11 on the bottom portion 15a, the reflective sheet 13, the luminance equalizer sheet 16, the diffusion member 17, and the optical sheet 18 are arranged in this order. The side portions 15b form four side walls of the box-shaped holding member 15. Thus, the side portions 15b have a pair of side portions 15b along the X direction and a pair of side portions 15b along the X direction. The side portions 15b restrict the positions of the substrate 11, the reflective sheet 13, the luminance equalizer sheet 16, the diffusion member 17, and the optical sheet 18, and also prevent light from leaking and foreign matter from entering.

The pair of side portions 15b along the X direction and the pair of side portions 15b along the Y direction of the holding member 15 have the first engagement protrusions 151 for engaging with the notches of the substrate 11 and the reflective sheet 13, and second engagement protrusions 152 for engaging with notches of the luminance equalizer sheet 16, as described later. The holding member 15 positions the substrate 11 and the reflective sheet 13 by the first engagement protrusions 151. The holding member 15 positions the luminance equalizer sheet 16 by the second engagement protrusions 152. The holding member 15 fixes the substrate 11, the reflective sheet 13, and the luminance equalizer sheet 16 so that the substrate 11, the reflective sheet 13, and the luminance equalizer sheet 16 are relatively positioned with respect to each other.

The luminance equalizer sheet 16 is disposed between the reflective sheet 13 and the diffusion member 17. The luminance equalizer sheets 16 are arranged at a predetermined distance from the substrate 11. The predetermined distance is about 2 mm or more and 10 mm or less from the substrate 11. The luminance equalizer sheet 16 is made of polyethylene terephthalate and the like. The luminance equalizer sheet 16 has a plurality of through holes 161 (see FIG. 6) of different sizes for transmitting light irradiated from the light emitting elements 12. In the luminance equalizer sheet 16, a part of the light irradiated from the light emitting elements 12 is transmitted through the through holes 161, and another part of the light is reflected toward the substrate 11 in areas where the through holes 161 are not formed. The luminance equalizer sheet 16 is designed by considering the size of the through holes 161, the number of the through holes 161, and the arrangement of the through holes 161 corresponding to the light emitting elements 12 so that the luminance in the light emitting surface of the light emitting device 10 is made uniform. By using the luminance equalizer sheet 16, the reflection of light is repeated between the reflective sheet 13 on the substrate 11 and the luminance equalizer sheet 16, and the luminance uniformity can be improved.

The luminance equalizer sheet 16 has a rectangular shape including four sides in plan view. Specifically, the luminance equalizer sheet 16 has a pair of sides along the X direction and a pair of sides along the Y direction. The pair of sides along the X direction and the pair of sides along the Y direction of the luminance equalizer sheet 16 have notches (not shown), respectively, for engaging with the second engagement protrusions 152 that are formed on the holding member 15. The luminance equalizer sheet 16 is positioned in the X direction by the notches formed on the pair of sides along the X direction and the second engagement protrusions 152. The luminance equalizer sheet 16 is positioned in the Y direction by the notches formed on the pair of sides along the Y direction and the second engagement protrusions 152. The luminance equalizer sheet 16 is relatively positioned relative to the substrate 11 and the reflective sheet 13 by the notches and the second engagement protrusions 152.

The diffusion member 17 is disposed between the luminance equalizer sheet 16 and the optical sheet 18. The diffusion member 17 is made of polycarbonate, for example. The diffusion member 17 may be in the form of a sheet. The diffusion member 17 can diffuse light that passes through the luminance equalizer sheet 16 and enters the diffusion member 17, and can also guide the light to a point where the through holes 161 are not formed on the front side of the luminance equalizer sheet 16.

The optical sheet 18 is disposed between the diffusion member 17 and the display panel 20. The optical sheet 18 includes, for example, a prism sheet 181 to increase the light utilization efficiency of the light emitting device 10, and a polarization control sheet 182 to increase the light utilization efficiency of the display panel 20. The optical sheet 18 may further include a viewing angle control sheet that narrows the viewing angle of the display device 100.

The display panel 20 is disposed at a frontmost surface of the display device 100. The display panel 20 is fixed near the opening of the holding member 15. The display panel 20 is fixed to the holding member 15 by fixing means such as double-sided tape. The display panel 20 is a liquid crystal panel. The display panel 20 has a plurality of pixels, and displays an image by each of the pixels transmitting or absorbing light from the light emitting device 10 depending on the applied voltage.

Effects of First Embodiment

In the first embodiment, the following effects can be obtained.

In the first embodiment, as described above, the first spacing S1 is larger than the second spacing S2. With this configuration, due to heat shrinkage of the reflective sheet 13 as the light emitting device 10 is used, the first spacing S1 in the opposite direction T1 of the approaching direction becomes smaller and the second spacing S2 in the approaching direction T2 becomes larger. In other words, with the passage of time after the start of use of the light emitting device 10, due to heat shrinkage of the reflective sheet 13, the difference between the first spacing S1 and the second spacing S2 becomes smaller until the size of the first spacing S1 and the size of the second spacing S2 become equal to each other. The smaller difference between the first spacing S1 and the second spacing S2 improves the luminance distribution around the light emitting elements 12, which also improves the luminance uniformity. Even after the size of the first spacing S1 becomes equal to the size of the second spacing S2 through long-term use, luminance uniformity equal to or better than the luminance uniformity at the start of use can be maintained until the size of the second spacing S2 becomes equal to the size of the first spacing S1 at the start of use. This makes it possible to maintain luminance uniformity equal to or better than the luminance uniformity at the start of use for a longer period of time, compared to a light emitting device in which the first spacing and the second spacing are formed to be approximately equal to each other at the start of use and in which luminance uniformity only deteriorates after the start of use. As a result, after long-term use of the light emitting device 10, a decrease in luminance uniformity due to changes in the relative positions of the light emitting elements 12 and the apertures 14 of the reflective sheet 13 caused by irreversible heat shrinkage of the reflective sheet 13 can be suppressed. The first spacing S1 is dimensioned based on both the reversible expansion and contraction amount caused by expansion and contraction due to the difference in the linear expansion coefficients of the substrate 11 and the reflective sheet 13, and the shrinkage amount caused by irreversible shrinkage accumulated over time by heating of the reflective sheet 13. This allows the first spacing S1 of each of the apertures 14 to be set in consideration of both the reversible expansion and contraction amount and the irreversible shrinkage amount. As a result of these, a decrease in luminance uniformity due to changes in the relative positions of the light emitting elements 12 and the apertures 14 of the reflective sheet 13 caused by irreversible heat shrinkage of the reflective sheet 13 can be suppressed after long-term use of the light emitting device 10, while suppressing the inconvenience caused by the difference in the linear expansion coefficients between the substrate 11 and the reflective sheet 13. Since the second spacing S2 becomes larger than the second spacing S2 at the start of use due to irreversible shrinkage caused by heating, the second spacing S2 can be formed smaller in advance, compared to a light emitting device in which the first spacing and the second spacing are formed approximately equal to each other at the start of use. By forming the second spacing S2 smaller in advance, the area covered by the reflective sheet 13 on the substrate 11 can be made larger, and thus the luminance of the light emitting device 10 as a whole can be improved.

Figure 5A:
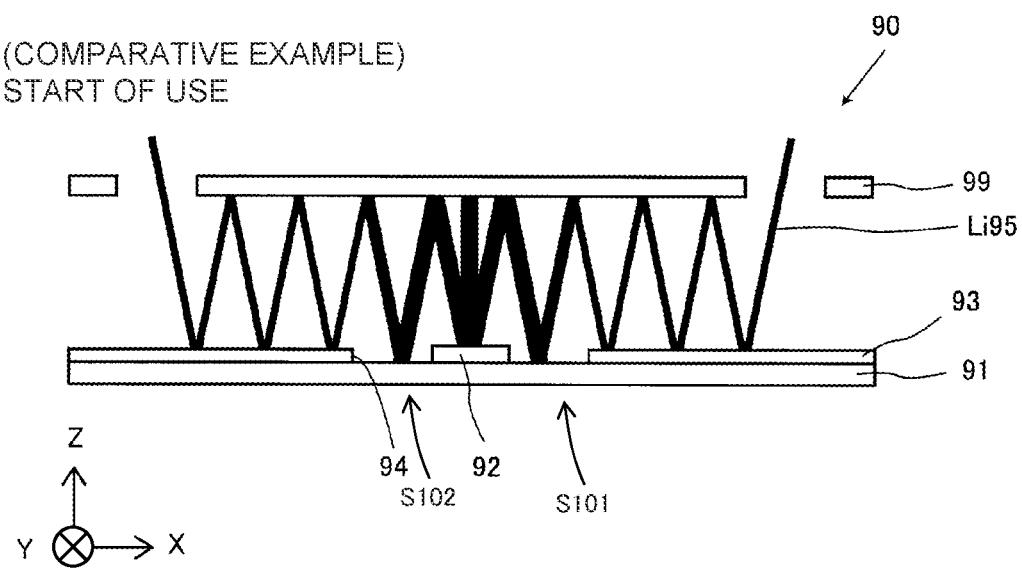
FIG. 5A is a cross-sectional schematic diagram showing a positional relationship between a substrate, a light emitting element, a reflective sheet and a luminance equalizer sheet at start of use of a light emitting device according to a comparative example.
Figure 5B:
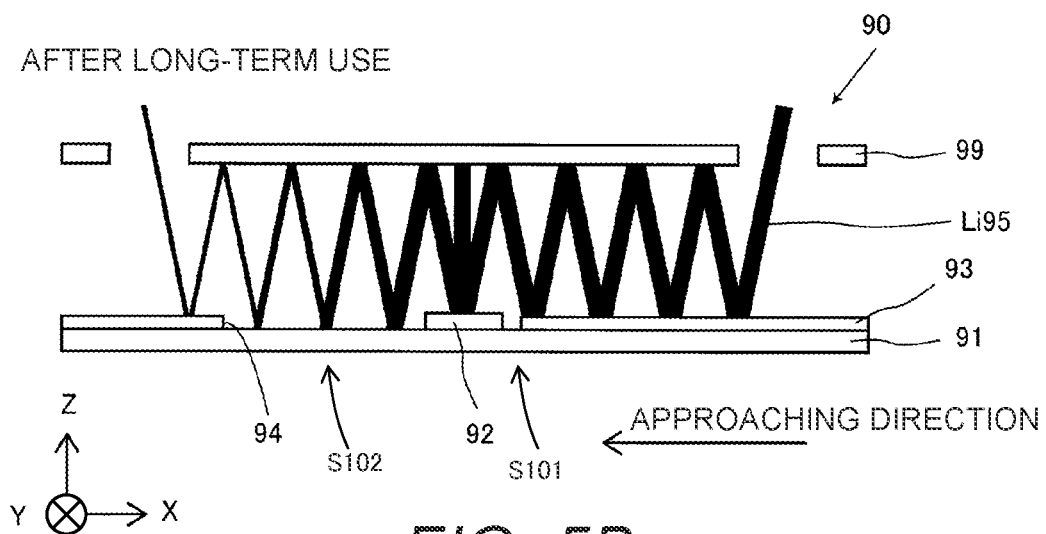
FIG. 5B is a cross-sectional schematic diagram showing a positional relationship between the substrate, the light emitting element, the reflective sheet and the luminance equalizer sheet after long-term use of the light emitting device according to the comparative example.
Figure 5C:
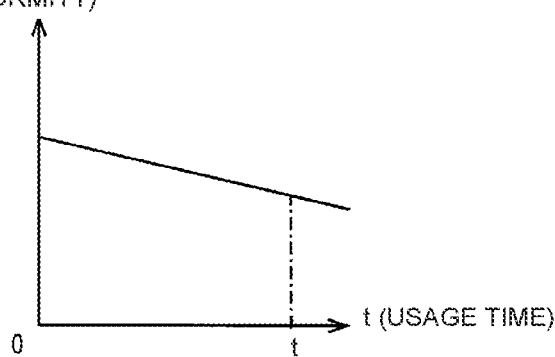
FIG. 5C is a graph showing change in luminance uniformity after the start of use of the light emitting device according to the comparative example.

Here, referring to FIGS. 5A to 5C and 6A to 6C, positional relationships between a substrate, a light emitting element, a reflective sheet, and a luminance equalizer sheet at start of use and during long-term use in a comparative example and this embodiment, and changes in luminance uniformity after the start of use will be explained. In FIGS. 5A to 5C and 6A to 6C, the substrate, the light emitting element, the reflective sheet, and the luminance equalizer sheet are fixed in a state in which they are relatively positioned via a holding member, which is not shown. FIGS. 5A and 5B illustrate a configuration of a light emitting device 90 according to the comparative example, that is equipped with a substrate 91, a plurality of light emitting elements 92 (only one is shown in the drawings), a reflective sheet 93, and a luminance equalizer sheet 99. In the comparative example, as shown in FIG. 5A, the light emitting element 92 is placed in the center of an aperture 94 of the reflective sheet 93 at the start of use of the light emitting device 90. The area of the substrate 91 exposed through the aperture 94 of the reflective sheet 93 has a lower reflectivity than the reflective sheet 93, and thus light Li 95 is more easily attenuated by the exposed area of the substrate 91 compared to the reflective sheet 93. Since the light emitting element 92 is placed in the center of the aperture 94 of the reflective sheet 93, a first spacing S101 that is disposed between the light emitting element 92 and the aperture 94 and disposed in the opposite direction, which is opposite to the approaching direction approaching the reference position P, relative to the light emitting element 92 and a second spacing S102 that is disposed between the light emitting element 92 and the aperture 94 and disposed in the approaching direction approaching the reference position P relative to the light emitting element 92 become substantially equal to each other. Therefore, as shown in FIG. 5C, the luminance uniformity is high around the light emitting element 92 at the start of use.

After long-term use of the light emitting device 90 according to the comparative example, irreversible shrinkage accumulated over time due to heating occurs in the reflective sheet 93. Therefore, as shown in FIG. 5B, after long-term use of the light emitting device 90, the aperture 94 of the reflective sheet 93 moves toward the reference position P with respect to the light emitting element 92 due to the irreversible heat shrinkage of the reflective sheet 93. As a result, the first spacing S101 becomes smaller, while the second spacing S102 becomes larger. As a result, after long-term use of the light emitting device 90, the difference between the first spacing S101 and the second spacing S102 becomes larger, and the luminance distribution of the light emitting device 90 changes compared to that at the start of use. As a result, as shown in FIG. 5C, the luminance uniformity only deteriorates after the start of use.

Figure 6A:
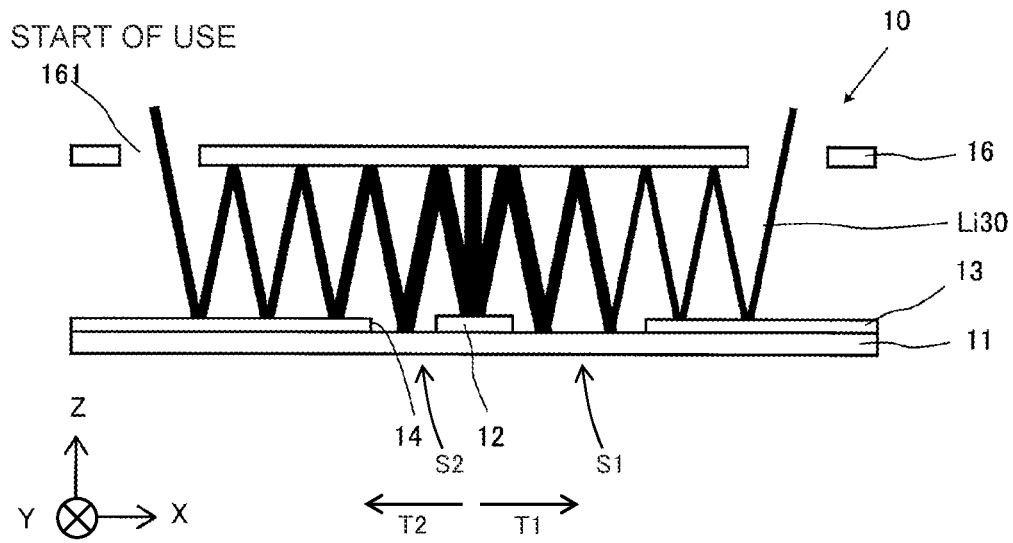
FIG. 6A is a cross-sectional schematic diagram showing a positional relationship between the substrate, the light emitting element, the reflective sheet and a luminance equalizer sheet at the start of use of the light emitting device according to the first embodiment.
Figure 6B:
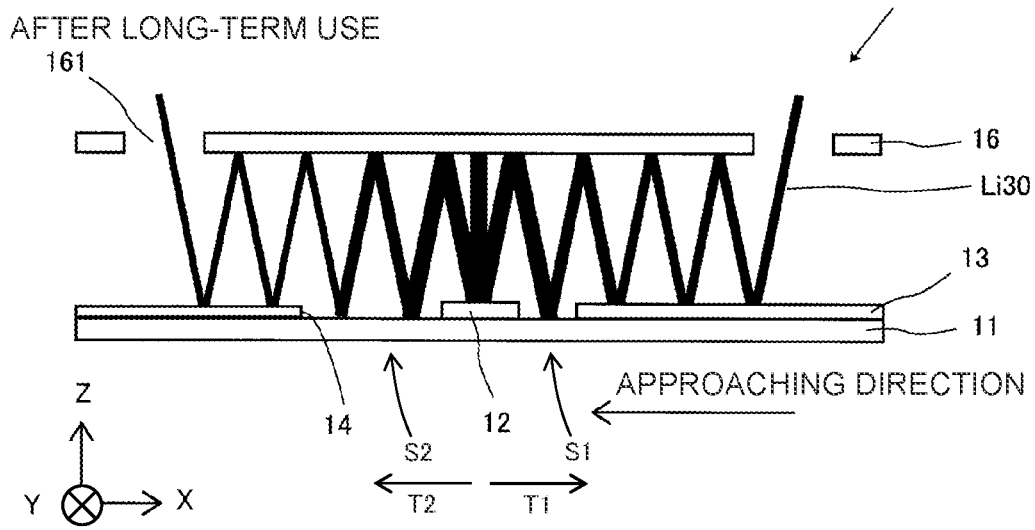
FIG. 6B is a cross-sectional schematic diagram showing a positional relationship between the substrate, the light emitting element, the reflective sheet and the luminance equalizer sheet after long-term use of the light emitting device according to the first embodiment.

FIGS. 6A and 6B illustrate a configuration of the light emitting device 10 according to the first embodiment, that is equipped with the substrate 11, the light emitting elements 12 (only one is shown in the drawings), the reflective sheet 13, and the luminance equalizer sheet 16. The reflective sheet 13 is configured such that the first spacing S1 that is disposed between the light emitting element 12 and the aperture 14 and disposed in the opposite direction T1, which is opposite to the approaching direction approaching the reference position P, relative to the light emitting element 12 is larger than the second spacing S2 that is disposed between the light emitting element 12 and the aperture 14 and disposed in the approaching direction T2 approaching the reference position P relative to the light emitting element 12.

Figure 6C:
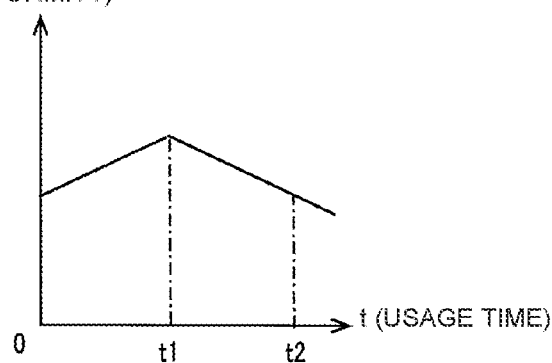
FIG. 6C is a graph showing change in luminance uniformity after the start of use of the light emitting device according to the first embodiment.

As described above, after long-term use of the light emitting device 10, the aperture 14 of the reflective sheet 13 moves toward the reference position P with respect to the light emitting element 12 due to irreversible heat shrinkage of the reflective sheet 13. Specifically, in this embodiment, the first spacing S1 is configured to be larger than the second spacing S2 at the start of use of the light emitting device 10. Then, due to the heat shrinkage of the reflective sheet 13, the first spacing S1 becomes smaller, and the spacing S2 becomes larger during the use of the light emitting device 10. Thus, as shown in FIG. 6C, after the start of use of the light emitting device 10, the difference between the first spacing S1 and the second spacing S2 becomes smaller until a timing t1, when the size of the first spacing S1 and the size of the second spacing S2 become equal to each other due to heat shrinkage of the reflective sheet 13. As the difference between the first spacing S1 and the second spacing S2 becomes smaller, the luminance distribution around the light emitting element 12 is improved, and thus the luminance uniformity is improved. Therefore, the luminance uniformity improves until the timing t1, when the size of the first spacing S1 becomes equal to the size of the second spacing S2. Even after the timing t1, when the size of the first spacing S1 and the size of the second spacing S2 become equal to each other due to the use of the light emitting device 10, the difference between the first spacing S1 and the second spacing S2 after the start of use is smaller than the difference between the first spacing S1 and the second spacing S2 at the start of use until a timing t2, when the size of the second spacing S2 after the start of use becomes equal to the size of the first spacing S1 at the start of use. Therefore, during the period from the timing t1 to the timing t2, the luminance uniformity equal to or better than the luminance uniformity at the start of use can be maintained. This makes it possible to maintain luminance uniformity equal to or better than the luminance uniformity at the start of use for a longer period of time, compared to the light emitting device 90 according to the comparison example, in which the first spacing S101 and the second spacing S102 are formed to be approximately equal to each other at the start of use and in which luminance uniformity only deteriorates after the start of use. As a result, a decrease in luminance uniformity due to changes in the relative positions of the light emitting element 12 and the aperture 14 of the reflective sheet 13 caused by irreversible heat shrinkage of the reflective sheet 13 can be suppressed after long-term use of the light emitting device 10, while suppressing the inconvenience caused by the difference in the linear expansion coefficients between the substrate 11 and the reflective sheet 13.

In the first embodiment, the apertures 14 include the first apertures 14b that are arranged along the straight line L1 (e.g., the first reference line) passing through the reference position P and have a rectangular shape in plan view, and the second apertures 14c that are arranged along the straight line L2 (e.g., the second reference line) orthogonal to the straight line L1 and passing through the reference position P and have a rectangular shape in plan view. With this configuration, even if the apertures 14 have the first apertures 14b and the second apertures 14c that are rectangular in plan view, the difference in luminance distribution around the light emitting elements 12 at the start of use and after long-term use of the light emitting device 10 can be suppressed. As a result, it is possible to suppress the decrease in the luminance uniformity due to the change in luminance distribution of the light emitting device 10 after long-term use of the light emitting device 10 compared to that at the start of use, while suppressing the inconvenience caused by the difference in linear expansion coefficients between the substrate 11 and the reflective sheet 13.

In the first apertures 14b and the second apertures 14c, an orthogonal spacing that is disposed between each of the first apertures 14b and the second apertures 14c and the corresponding one of the light emitting elements 12 and disposed in a direction orthogonal to a direction of irreversible shrinkage of the reflective sheet 13 relative the respective one of the light emitting elements 12 is less affected by shrinkage due to heating than the second spacing. Here, the direction of irreversible shrinkage of the reflective sheet 13 is the approaching direction T2 approaching the reference position P. Therefore, by reducing the width of the orthogonal spacing, the area covered by the reflective sheet 13 on the substrate 11 can be increased. Therefore, in the first embodiment, as described above, the light emitting elements 12 have a rectangular shape in plan view, and the pair of long sides of the light emitting elements 12 are substantially parallel to the pair of long sides of the first apertures 14b and the pair of long sides of the second apertures 14c. With this configuration, the orthogonal spacing less affected by the shrinkage due to heating among spacings between the apertures 14b and 14c and the light emitting elements 12 can be made smaller in advance by matching the direction of the pair of long side and the direction of the pair of short side of the first apertures 14b and the second apertures 14c with the direction of the pair of long sides and the direction of the pair of short side of the light emitting elements 12. As a result, the area covered by the reflective sheet 13 on the substrate 11 can be enlarged, and thus the luminance of the light emitting device 10 as a whole can be further improved.

In the first embodiment, as described above, the reference position P is located at the intersection of the straight line L2 connecting the pair of first positioning portions for positioning the reflective sheet 13 and the straight line L1 connecting the pair of second positioning portions for positioning the reflective sheet 13, which are different from the pair of first positioning portions. With this configuration, the substrate 11 and the reflective sheet 13 can be easily positioned at the reference position P, and thus the assemblability of the reflective sheet 13 can be improved.

In the first embodiment, as described above, the apertures 14 include the reference aperture 14a, the reference position P being located at the center of the reference aperture 14a. With this configuration, the substrate 11 and the reflective sheet 13 can be positioned more easily at the reference position P that is provided at the center of the reference aperture 14a, and thus the assemblability of the reflective sheet 13 can be improved.

In the first embodiment, as described above, the apertures 14 are configured such that the first spacing S1 is larger than the orthogonal spacing that is disposed between each of the apertures 14 and the respective one of the light emitting elements 12 and disposed in the direction orthogonal to the approaching direction T2 relative to the respective one of the light emitting elements 12. With this configuration, the orthogonal spacing less affected by the shrinkage due to heating among spacings between the apertures 14 and the light emitting elements 12 can be made smaller in advance, and the decrease in luminance uniformity due to changes in the relative positions of the light emitting elements 12 and the apertures 14 of the reflective sheet 13 caused by irreversible heat shrinkage of the reflective sheet 13 can be suppressed after long-term use of the light emitting device 10.

Second Embodiment

Figure 7:
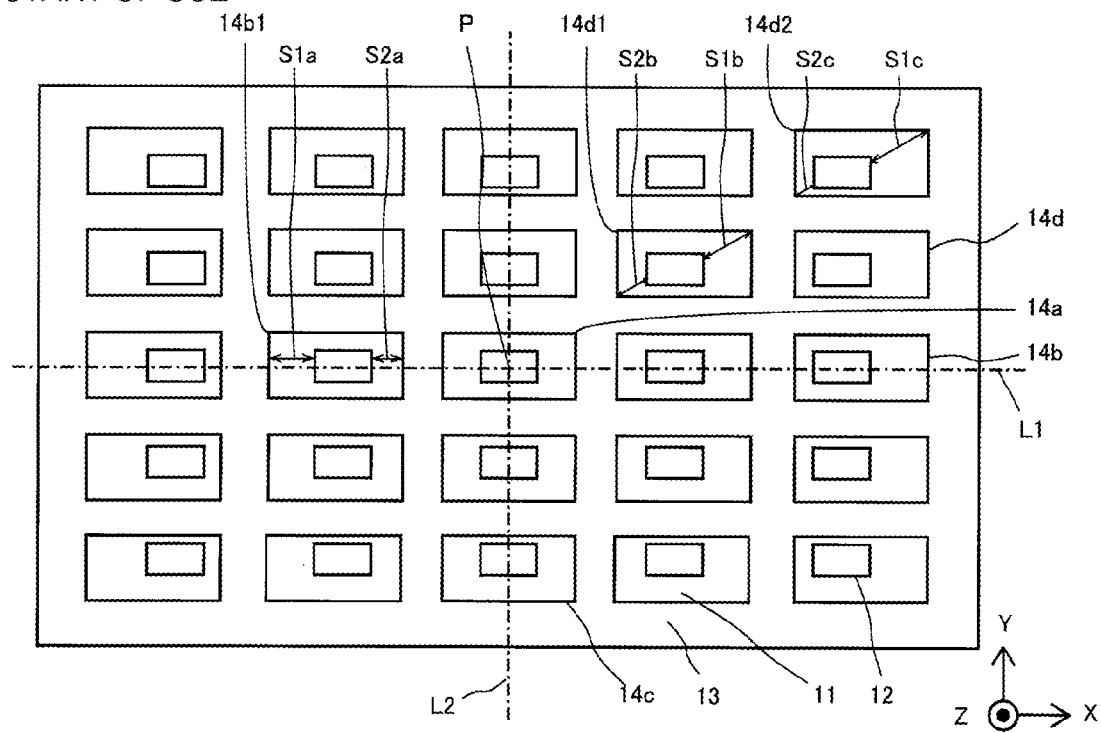
FIG. 7 is a planar schematic diagram showing a positional relationship between a substrate, a plurality of light emitting elements and a reflective sheet at start of use of a light emitting device according to a second embodiment.
Figure 8:
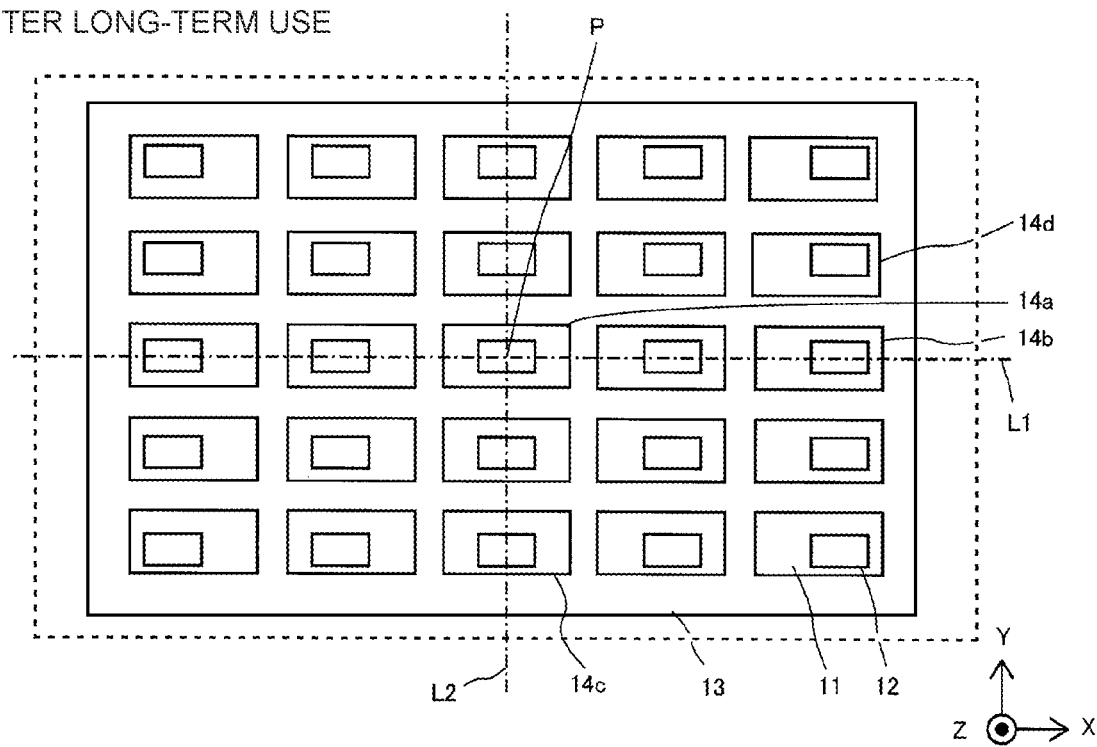
FIG. 8 is a planar schematic diagram showing a positional relationship between the substrate, the light emitting elements and the reflective sheet after long-term use of the light emitting device according to the second embodiment.

Referring to FIGS. 7 and 8, the configuration of a light emitting device 10 according to a second embodiment will be described. In view of the similarity between the first and second embodiments, the parts of the second embodiment that are similar or identical to the parts of the first embodiment will be given the same reference numerals as the parts of the first embodiment. Moreover, the descriptions of the parts of the second embodiment that are similar or identical to the parts of the first embodiment may be omitted for the sake of brevity.

As shown in FIG. 7, the light emitting device 10 according to the second embodiment is basically identical to the light emitting device 10 according to the first embodiment, except for the positional relationship between the apertures 14 and the light emitting elements 12 at start of use of the light emitting device 10. FIG. 8 illustrates the positional relationship between the apertures 14 and the light emitting elements 12 after long-term use of the light emitting device 10 according to the second embodiment. As shown in FIG. 7, the apertures 14 can further be configured such that at start of use of the light emitting device 10, the apertures 14 have a polygonal shape having at least a pair of long sides and a pair of short sides in plan view, and are configured such that the first spacing increases as a position of each of the apertures 14 moving away from the reference position P.

Specifically, as in the first embodiment, the apertures 14 includes the reference aperture 14a, the first apertures 14b, the second apertures 14c and the third apertures 14d. As shown in FIG. 7, the first apertures 14b have the first spacing that increases as moving away from the reference position P along the straight line L1 and the second apertures 14c have the first spacing that increases as moving away from the reference position P along the straight line L2. In other words, in the illustrated embodiment, a pair of the first apertures 14b that are adjacent to the reference aperture 14a have the same first spacing, while the remainder pair of the first apertures 14b have the same first spacing that is larger than the first spacing of the pair of the first apertures 14b that are adjacent to the reference aperture 14a. Similarly, a pair of the second apertures 14c that are adjacent to the reference aperture 14a have the same first spacing, while the remainder pair of the second apertures 14c have the same first spacing that is larger than the first spacing of the pair of the second apertures 14b that are adjacent to the reference aperture 14a. Furthermore, four of the third apertures 14d that are adjacent to the reference aperture 14a have the same first spacing and the smallest first spacing of the third apertures 14d, four of the third apertures 14d that are located at the four corners of the reflective sheet 13 have the same first spacing and the largest first spacing of the third apertures 14d, and the remainder of the third apertures 14d have the first spacing that is larger than the smallest first spacing of the third apertures 14d and is smaller than the largest first spacing of the third apertures 14d.

Furthermore, for example, as shown in FIG. 7, at the start of use of the light emitting device 10, one of the first apertures 14b (a first aperture 14b1) has a first spacing S1a and a second spacing S2a that is smaller than the first spacing S1a, one of the third apertures 14d (a third aperture 14d1) has a first spacing S1b and a second spacing S2b that is smaller than the first spacing S1b, and another one of the third apertures 14d (a third aperture 14d2) has a first spacing S1c and a second spacing S2c that is smaller than the first spacing S1c. The first aperture 14b1, the third aperture 14d1 and the third aperture 14d2 are spaced apart from the reference position P by the distance that increases in this order, while the size of their first spacings S1a, S1b and S1c also increases in this order. Here, the distance between an aperture and the reference position P can be defined as a distance between the center or centroid of the polygonal shape of the aperture and the reference position P. Alternatively, the distance can be defined as a distance between the farthest part of the aperture from the reference position P and the reference position P. However, the distance between an aperture and the reference position P can further be differently defined as needed and/or desired.

In FIG. 7, the apertures 14 have a rectangular shape in plan view, but they may be hexagonal, for example, as long as they have at least a pair of long sides and a pair of short sides.

The other configuration of the second embodiment is the same as the first embodiment above.

Effects of Second Embodiment

The further away from the reference position P, the larger the relative positional shift between the light emitting elements 12 and the apertures 14 of the reflective sheet 13 caused by the reversible expansion and contraction due to the difference in the linear expansion coefficients of the substrate 11 and the reflective sheet 13 and the irreversible shrinkage accumulated over time by heating of the reflective sheet 13 after long-term use of the light emitting device 10. In the second embodiment, as described above, the apertures 14 have a polygonal shape having at least a pair of long sides and a pair of short sides in plan view, and are formed such that the first spacing S1 increases as the position of each of the apertures 14 moving away from the reference position P. With this configuration, the first spacing S1 of each of the apertures 14 can be set in consideration of both the reversible expansion and contraction amount and the irreversible shrinkage amount in the apertures 14 located relatively close to the reference position P and the apertures located relatively far from the reference position P. With this configuration, it is possible to further suppress the decrease in the luminance uniformity after long-term use of the light emitting device 10, while suppressing the inconvenience caused by the difference in the linear expansion coefficients between the substrate 11 and the reflective sheet 13.

In addition, other effects of the second embodiment are the same as those of the first embodiment.

Third Embodiment

Figure 9:
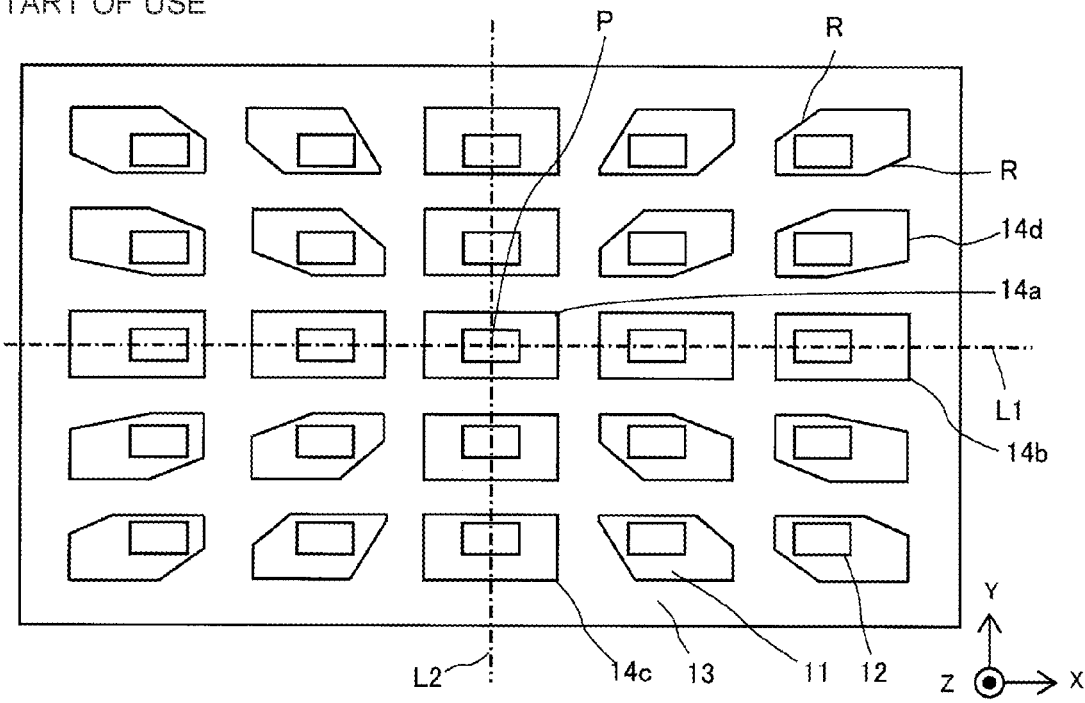
FIG. 9 is a planar schematic diagram showing a positional relationship between a substrate, a plurality of light emitting elements and a reflective sheet at start of use of a light emitting device according to a third embodiment.
Figure 10:
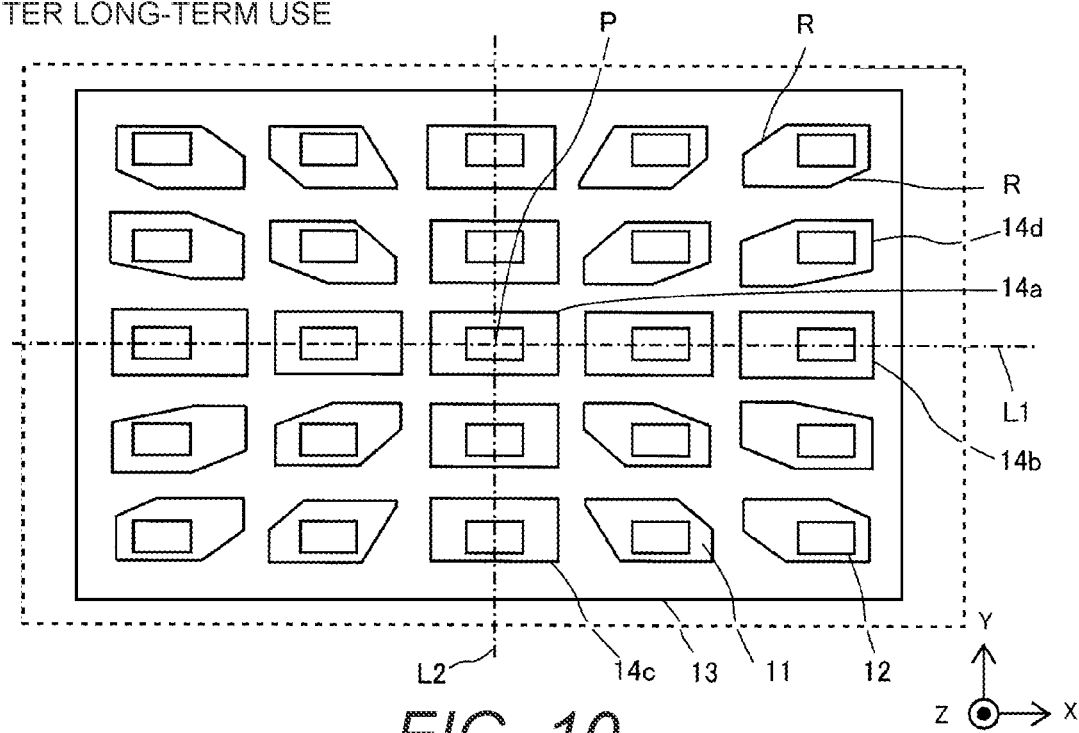
FIG. 10 is a planar schematic diagram showing a positional relationship between the substrate, the light emitting elements and the reflective sheet after long-term use of the light emitting device according to the third embodiment.

Referring to FIGS. 9 and 10, the configuration of a light emitting device 10 according to a third embodiment will be described. In view of the similarity between the first to third embodiments, the parts of the third embodiment that are similar or identical to the parts of the first and second embodiments will be given the same reference numerals as the parts of the first and second embodiment. Moreover, the descriptions of the parts of the third embodiment that are similar or identical to the parts of the first and second embodiments may be omitted for the sake of brevity.

As shown in FIG. 9, the light emitting device 10 according to the third embodiment is identical to the light emitting device 10 according to the first or second embodiment, except for the shape of the third apertures 14d. FIG. 10 illustrates the positional relationship between the apertures 14 and the light emitting elements 12 after long-term use of the light emitting device 10 according to the third embodiment. As shown in FIG. 9, the third apertures 14d according to the third embodiment are arranged in areas other than areas along the straight line L1 (e.g., the first reference line) and the straight line L2 (e.g., the second reference line) and each have a pair of inclined sides R inclined to the straight line L1 and the straight line L2 in plan view. The pair of inclined sides R of each of the third apertures 14d each extend along an approaching direction approaching the reference position P. In other words, the pair of inclined sides R of each of the third apertures 14d each extend along a direction in which the reflective sheet 13 irreversibly shrinks due to heating. More specifically, in the illustrated embodiment, the pair of inclined sides R of each of the third apertures 14d each extend in a radial direction relative to the reference position P. In the third embodiment, the third apertures 14d have a hexagonal shape in plan view, but the shape of the third apertures 14d is not limited to a hexagonal shape as long as it has a pair of inclined sides inclined with respect to a first pair of sides and a second pair of sides of the reflective sheet 13.

The other configurations of the third embodiment are the same as those of the second embodiment above.

Effects of Third Embodiment

In the third embodiment, as described above, the apertures 14 further include the third apertures 14d that are arranged in the areas other than the areas along the straight line L1 (e.g., the first reference line) and the straight line L2 (e.g., the second reference line). The third apertures 14d haves the pair of inclined sides R inclined to the straight line L1 and the straight line L2 in plan view. In each of the third apertures 14d, an orthogonal spacing that is disposed between the third aperture 14d and the light emitting element 12 and is disposed in a direction orthogonal to the direction of irreversible shrinkage of the reflective sheet 13 relative to the light emitting element 12 is less affected by shrinkage due to heating than the second spacing S2 that is disposed in the approaching direction T2 approaching the reference position P relative to the light emitting element 12. Here, the direction of irreversible shrinkage of the reflective sheet 13 is the approaching direction T2 approaching the reference position P. Therefore, by reducing the width of the orthogonal spacing, even in the third apertures 14d, the area covered by the reflective sheet 13 on the substrate 11 can be increased. With this configuration, even in the third apertures 14d, the orthogonal spacing less affected by the shrinkage due to heating among spacings between the third apertures 14d and the light emitting elements 12 can be made smaller in advance. As a result, the area covered by the reflective sheet 13 on the substrate 11 can be enlarged, and thus the luminance of the light emitting device 10 as a whole can be further improved.

In addition, other effects of the third embodiment are the same as those of the second embodiment.

Fourth Embodiment

Figure 11:
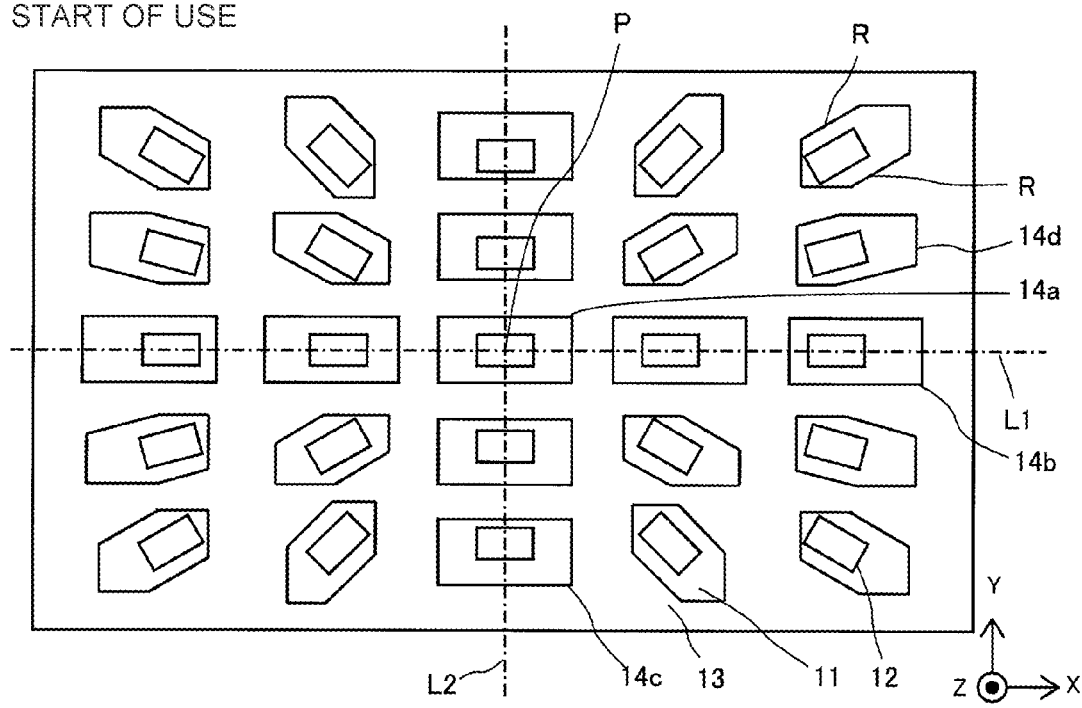
FIG. 11 is a planar schematic diagram showing a positional relationship between a substrate, a plurality of light emitting elements and a reflective sheet at start of use of a light emitting device according to a fourth embodiment.
Figure 12:
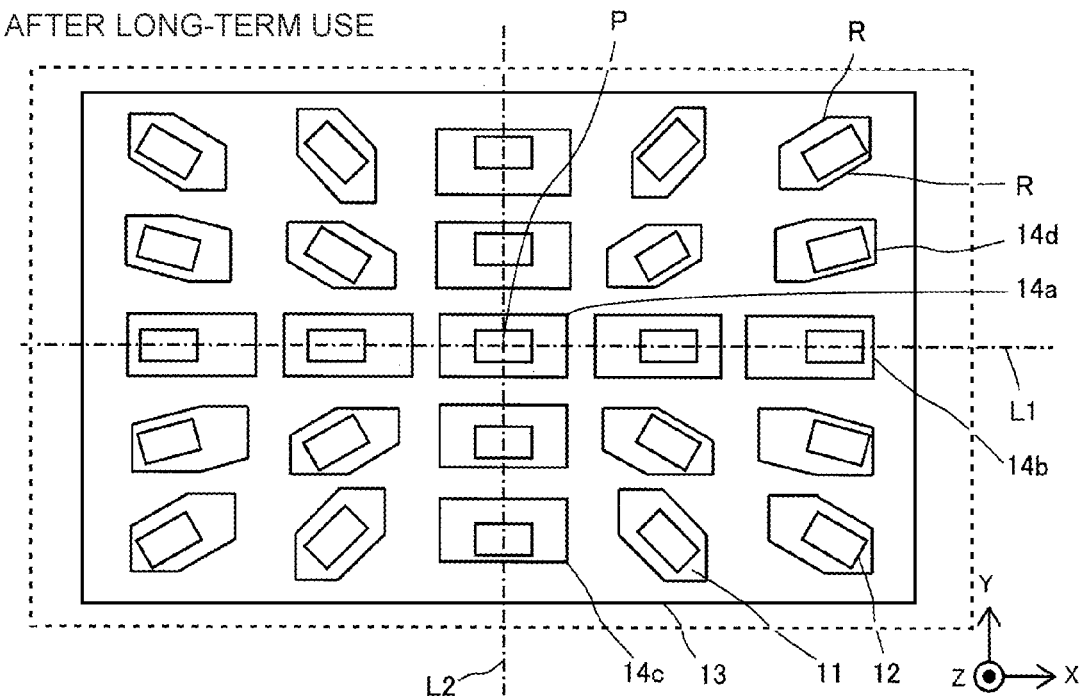
FIG. 12 is a planar schematic diagram showing a positional relationship between the substrate, the light emitting elements and the reflective sheet after long-term use of the light emitting device according to the fourth embodiment.

Referring to FIGS. 11 and 12, the configuration of a light emitting device 10 according to a fourth embodiment will be described. In view of the similarity between the first to fourth embodiments, the parts of the fourth embodiment that are similar or identical to the parts of the first to third embodiments will be given the same reference numerals as the parts of the first to third embodiment. Moreover, the descriptions of the parts of the fourth embodiment that are similar or identical to the parts of the first to third embodiments may be omitted for the sake of brevity.

As shown in FIG. 11, the light emitting device according to the fourth embodiment is identical to the light emitting device 10 according to the first, second or third embodiment, except for the shape of the third apertures 14d and the orientation of the light emitting device 10 disposed within the third apertures 14d. FIG. 12 illustrates the positional relationship between the apertures 14 and the light emitting elements 12 after long-term use of the light emitting device 10 according to the fourth embodiment. As shown in FIG. 11, the light emitting elements 12 have a rectangular shape in plan view. Specifically, the light emitting elements 12 that are disposed within the first apertures 14b (and the reference aperture 14a) are oriented such that their center axes extending along their long sides coincide with the straight line L1, while the light emitting elements 12 that are disposed within the second apertures 14c (and the reference aperture 14a) are oriented such that their center axes extending along their short sides coincide with the straight line L2. Furthermore, the light emitting elements 12 that are disposed within the third apertures 14d are oriented such that their center axes extending along their long sides extends in a radial direction relative to the reference position P.

Furthermore, as in the third embodiment, the third apertures 14d each have the pair of inclined sides R inclined to the straight line L1 and the straight line L2 in plan view. The pair of inclined sides R of each of the third apertures 14d each extend along the center axis of the respective one of the light emitting elements 12 that extends along its long sides. Thus, the light emitting elements 12 that are disposed within the third apertures 14d have a pair of long sides that are substantially parallel to the pair of inclined sides R of the third apertures 14d.

The other configurations of the fourth embodiment are the same as those of the third embodiment above.

Effects of Fourth Embodiment

In the fourth embodiment, as described above, the light emitting elements 12 have a rectangular shape in plan view, and have the pair of long sides that are substantially parallel to the pair of inclined sides R of the third apertures 14d. In each of the third apertures 14d, an orthogonal spacing that is disposed between the third aperture 14d and the light emitting element 12 and is disposed in a direction orthogonal to the direction of irreversible shrinkage of the reflective sheet 13 relative to the light emitting element 12 is less affected by shrinkage due to heating than the second spacing S2 that is disposed in the approaching direction T2 approaching the reference position P relative to the light emitting element 12. Here, the direction of irreversible shrinkage of the reflective sheet 13 is the approaching direction T2 approaching the reference position P. Therefore, by reducing the width of the orthogonal spacing, in the third aperture 14d, the area covered by the reflective sheet 13 on the substrate 11 can be increased. With this configuration, by matching the direction in which the pair of inclined sides R in the third aperture 14d extends with the direction of the pair of long sides in the light emitting elements 12, the orthogonal spacing less affected by shrinkage due to heating among spacings between the third apertures 14d and the light emitting elements 12 can be made smaller in advance. As a result, the area covered by the reflective sheet 13 on the substrate 11 can be enlarged, and thus the luminance of the light emitting device 10 as a whole can be further improved.

In addition, other effects of the fourth embodiment are the same as those of the third embodiment.

Fifth Embodiment

Figure 13:
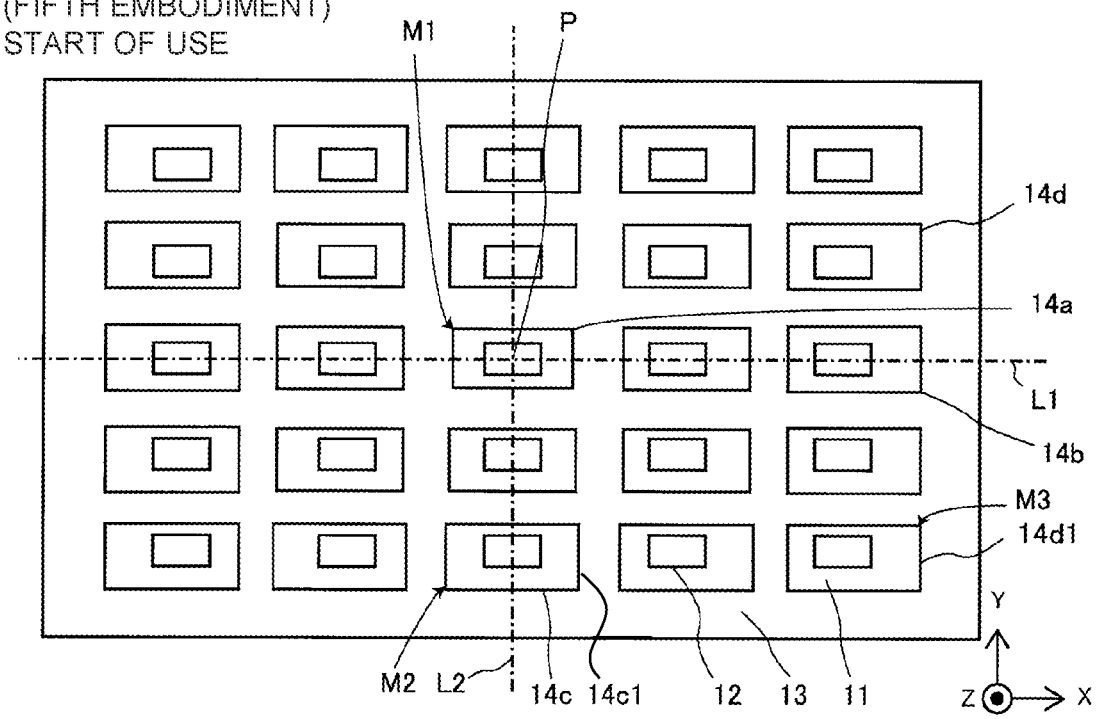
FIG. 13 is a planar schematic diagram showing a positional relationship between a substrate, a plurality of light emitting elements and a reflective sheet at start of use of a light emitting device according to a fifth embodiment.
Figure 14:
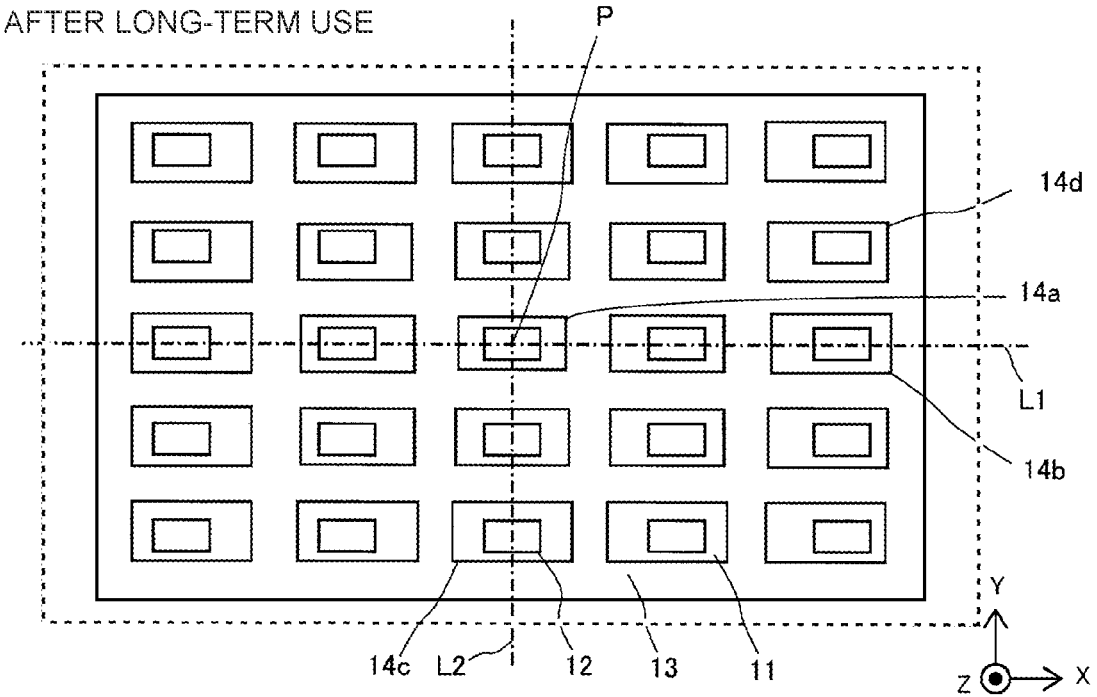
FIG. 14 is a planar schematic diagram showing a positional relationship between the substrate, the light emitting elements and the reflective sheet after long-term use of the light emitting device according to the fifth embodiment.

Referring to FIGS. 13 and 14, the configuration of a light emitting device 10 according to a fifth embodiment will be described. In view of the similarity between the first to fifth embodiments, the parts of the fifth embodiment that are similar or identical to the parts of the first to fourth embodiments will be given the same reference numerals as the parts of the first to fourth embodiment. Moreover, the descriptions of the parts of the fifth embodiment that are similar or identical to the parts of the first to fourth embodiments may be omitted for the sake of brevity.

As shown in FIG. 13, the light emitting device 10 according to the fifth embodiment is basically identical to the light emitting device 10 according to the first embodiment, except for an area M (e.g., an aperture area) of the apertures 14. FIG. 14 illustrates the positional relationship between the apertures 14 and the light emitting elements 12 after long-term use of the light emitting device 10 according to the fifth embodiment. As shown in FIG. 13, the apertures 14 can further be configured such that the area M of the apertures 14 increases as a position of each of the apertures 14 moving away from the reference position P.

Specifically, as in the first embodiment, the apertures 14 includes the reference aperture 14a, the first apertures 14b, the second apertures 14c and the third apertures 14d. As shown in FIG. 13, the first apertures 14b have the area M that increases as moving away from the reference position P along the straight line L1 and the second apertures 14c have the area M that increases as moving away from the reference position P along the straight line L2. In other words, in the illustrated embodiment, a pair of the first apertures 14b that are adjacent to the reference aperture 14a have the same area M that is larger than the area M of the reference aperture 14a, while the remainder pair of the first apertures 14b have the same area M that is larger than the area M of the pair of the first apertures 14b that are adjacent to the reference aperture 14a. Similarly, a pair of the second apertures 14c that are adjacent to the reference aperture 14a have the same area M that is larger than the area M of the reference aperture 14a, while the remainder pair of the second apertures 14c have the same area M that is larger than the area M of the pair of the second apertures 14b that are adjacent to the reference aperture 14a. Furthermore, four of the third apertures 14d that are adjacent to the reference aperture 14a have the same area M that is the smallest of the third apertures 14d, four of the third apertures 14d that are located at the four corners of the reflective sheet 13 have the same area M that is the largest of the third apertures 14d, and the remainder of the third apertures 14d have the area M that is larger than the smallest area M of the third apertures 14d and is smaller than the largest area M of the third apertures 14d.

Furthermore, for example, as shown in FIG. 13, at the start of use of the light emitting deice 10, the reference aperture 14a has an aperture area M1, one of the second aperture 14c (a second aperture 14c1) has an aperture area M2, and one of the third aperture 14d (a third aperture 14d1) has an aperture area M3. The reference aperture 14a, the second aperture 14c1 and the third aperture 14d1 are spaced apart from the reference position P by the distance that increases in this order, while the aperture areas M1, M2 and M3 also increase in this order.

The other configurations of the fifth embodiment are the same as those of the first embodiment above.

Effects of Fifth Embodiment

In the fifth embodiment, as described above, the apertures 14 are configured such that the area M of the apertures 14 increases as the position of each of the apertures 14 moving away from the reference position P. With this configuration, the area M of the apertures 14 can be set in consideration of the reversible expansion and contraction amount caused by expansion and contraction due to the difference in the linear expansion coefficients of the substrate 11 and the reflective sheet 13, and the shrinkage amount caused by irreversible shrinkage accumulated over time by heating of the reflective sheet 13 in the apertures 14 located relatively close to the reference position P and the apertures 14 located relatively far from the reference position P. With this configuration, it is possible to further suppress the decrease in the luminance uniformity after long-term use of the light emitting device 10.

Sixth Embodiment

Figure 15:
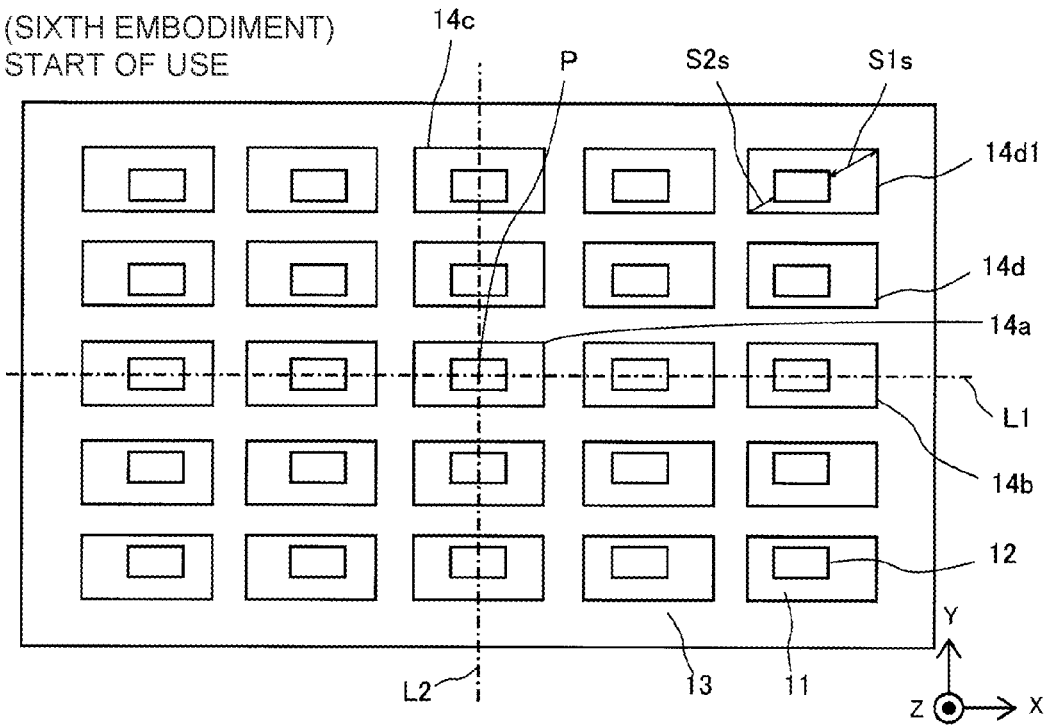
FIG. 15 is a planar schematic diagram showing a positional relationship between a substrate, a plurality of light emitting elements and a reflective sheet at start of use of a light emitting device according to a sixth embodiment.
Figure 16:
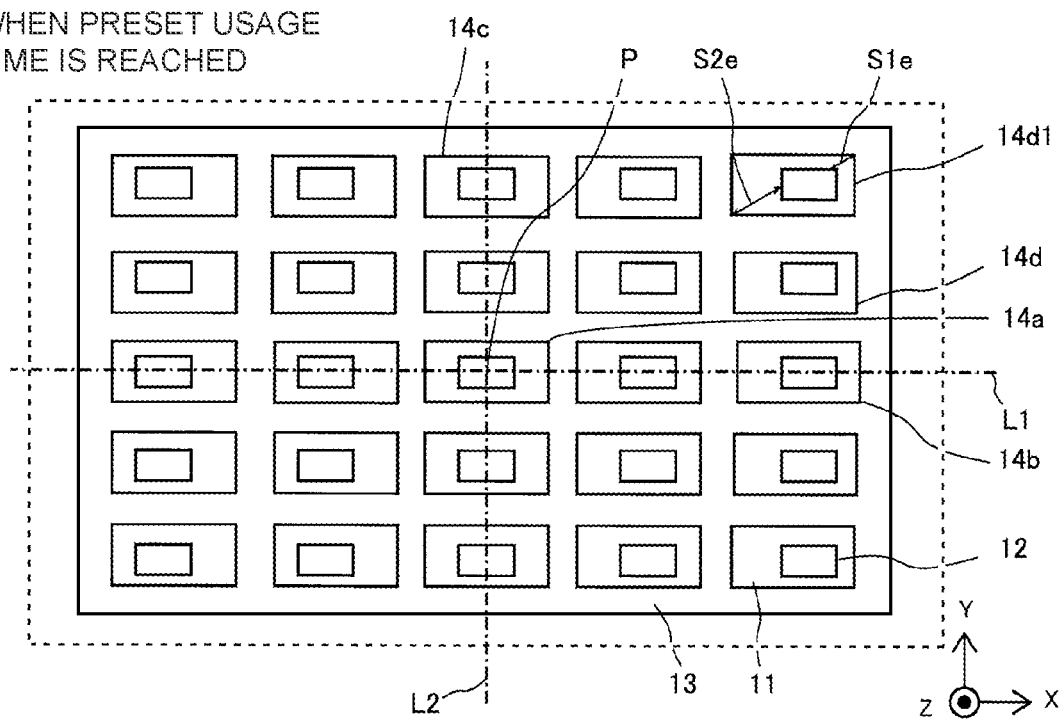
FIG. 16 is a planar schematic diagram showing a positional relationship between the substrate, the light emitting elements and the reflective sheet at a time when a preset usage time is reached in the light emitting device according to the sixth embodiment.

Referring to FIGS. 15 and 16, the configuration of a light emitting device 10 according to a sixth embodiment will be described. In view of the similarity between the first to sixth embodiments, the parts of the sixth embodiment that are similar or identical to the parts of the first to fifth embodiments will be given the same reference numerals as the parts of the first to fifth embodiment. Moreover, the descriptions of the parts of the sixth embodiment that are similar or identical to the parts of the first to fifth embodiments may be omitted for the sake of brevity.

As shown in FIGS. 15 and 16, in the sixth embodiment, the apertures 14 can be configured such that a state in which the size of the second spacing S2 between the light emitting elements 12 and the apertures 14 is smaller than the size of the first spacing S1 between the light emitting elements 12 and the apertures 14 at start of use of the light emitting device 10 (see FIG. 15) is reversed so as to be a state in which the size of the second spacing S2 between the light emitting elements 12 and the apertures 14 is larger than the size of the first spacing S1 between the light emitting elements 12 and the apertures 14 at a time when a preset usage time of the light emitting device 10 is reached (see FIG. 16), and such that the size of the second spacing S2 at the time when the preset usage time of the light emitting device 10 is reached (see FIG. 16) is approximately equal to the size of the first spacing S1 at the start of use of the light emitting device 10 (see FIG. 15).

For example, as shown in FIGS. 15 and 16, one of the third apertures 14 (a third aperture 14$d$1) is configured such that a state in which the size of a second spacing S2$s$ of the third aperture 14$d$1 is smaller than the size of a first spacing S1$s$ of the third aperture 14$d$1 at the start of use of the light emitting device 10 (see FIG. 15) is reversed so as to be a state in which the size of a second spacing S2$e$ of the third aperture 14$d$1 is larger than the size of a first spacing S1$e$ of the third aperture 14$d$1 at the time when the preset usage time of the light emitting device 10 is reached (see FIG. 16), and such that the size of the second spacing S2$e$ at the time when the preset usage time of the light emitting device 10 is reached (see FIG. 16) is approximately equal to the size of the first spacing S1$s$ at the start of use of the light emitting device 10 (see FIG. 15). Referring to FIGS. 15 and 16, one specific example will be described. With the third aperture 14$d$1, as shown in FIG. 15, the third aperture 14$d$1 is disposed at a distance of about 155 mm from the reference position P and has the first spacing S1$s$ of 2.0 mm and the second spacing S2$s$ of 0.5 mm at the start of use of the light emitting device 10. Therefore, at the start of use of the light emitting device 10, the size of the second spacing S2$s$ is smaller than the size of the first spacing S1$s$. Thereafter, with the third aperture 14$d$1, as shown in FIG. 16, the size of the first spacing S1$e$ becomes about 0.5 mm and the size of the second spacing S2$e$ becomes about 2.0 mm when the preset usage time of the light emitting device 10, which is 1000 hours of high temperature operation, is reached. Therefore, the size of the second spacing S2$e$ is reversed so as to be a state in which it is larger than the size of the first spacing S1$e$, and the size of the second spacing S2$e$ (about 2.0 mm) at the time when the preset usage time of the light emitting device 10 is reached is approximately equal to the size of the first spacing S1$s$ (2.0 mm) at the start of use of the light emitting device 10.

The other configurations of the sixth embodiment are the same as those of the first embodiment above.

Effect of Sixth Embodiment

In the sixth embodiment, as described above, the apertures 14 are configured such that a state in which the size of the second spacing S2 between the light emitting elements 12 and the apertures 14 is smaller than the size of the first spacing S1 between the light emitting elements 12 and the apertures 14 at the start of use of the light emitting device 10 is reversed so as to be a state in which the size of the second spacing S2 between the light emitting elements 12 and the apertures 14 is larger than the size of the first spacing S1 between the light emitting elements 12 and the apertures 14 at the time when the preset usage time of the light emitting device 10 is reached, and such that the size of the second spacing S2 at the time when the preset usage time of the light emitting device 10 is reached is approximately equal to the size of the first spacing S1 at the start of use of the light emitting device 10. With this configuration, a difference between a difference between the first spacing S1 and the second spacing S2 at the start of use of the light emitting device 10 and a difference between the first spacing S1 and the second spacing S2 at the time when the preset usage time of the light emitting device 10 is reached can be eliminated. Therefore, the luminance uniformity at the start of use of the light emitting device 10 and at the time when the preset usage time is reached can be made equal to each other.

Modification Examples

The embodiments disclosed here are illustrative and are not restrictive in all respects. The scope of the invention is indicated by the claims rather than by the description of the embodiments described above, and furthermore includes all modifications (modification examples) within the meaning and scope of the claims and their equivalents.

For example, in the first embodiment above, an example is shown in which the light emitting elements 12 have a rectangular shape in plan view, but the present invention is not limited to this. For example, the shape of the light emitting elements 12 may be a square, a circle, and the like other than a rectangle in plan view.

In the first embodiment above, an example is shown in which the apertures 14 have a rectangular shape, and in the second embodiment above, an example is shown in which the apertures 14 have a polygonal shape having at least the pair of long sides and the pair of short sides in plan view, but the present invention is not limited to this. For example, the shape of the apertures 14 may be a circle, an ellipse, and the like other than a rectangle or polygon shape in plan view.

In the first embodiment above, an example is shown in which the apertures 14 are arranged in a matrix in plan view to surround the reference position P, but the present invention is not limited to this. For example, the apertures 14 only need to be provided corresponding to the arrangement of the light emitting elements 12, and need not to be arranged in a matrix.

Figure 17:
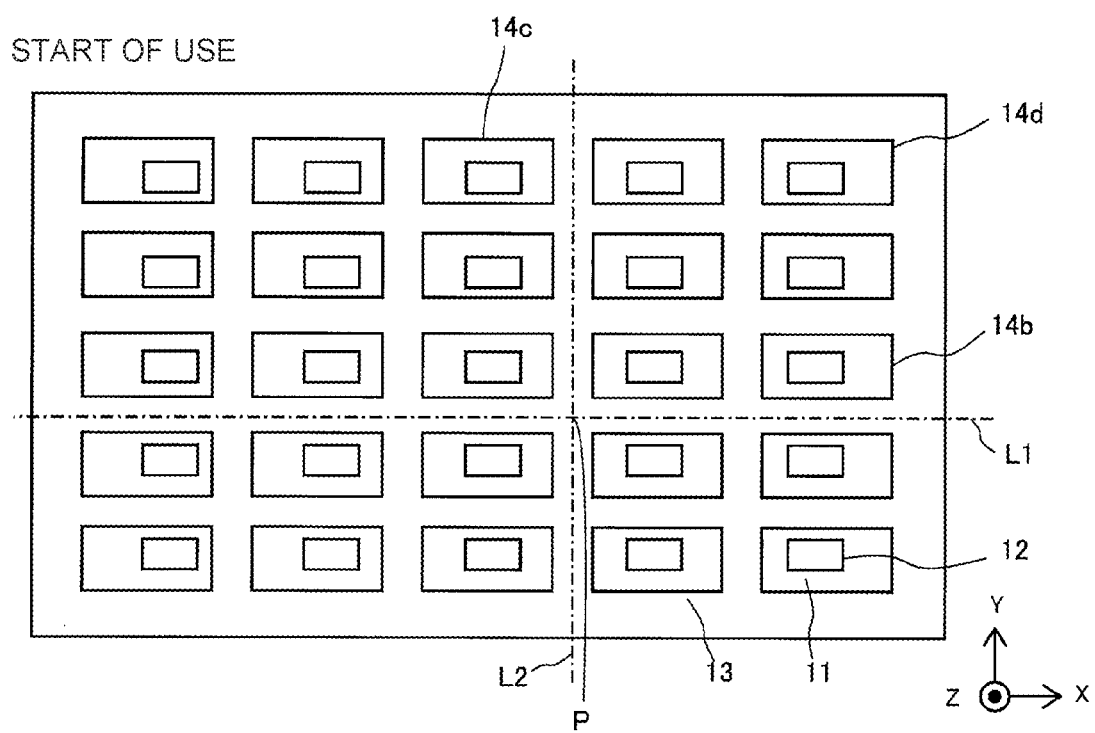
FIG. 17 is a planar schematic diagram showing a positional relationship between a substrate, a plurality of light emitting elements and a reflective sheet at start of use of a light emitting device according to a modification example.

In the first embodiment above, an example is shown in which the intersection, which is the reference position P, is included at the center of the reference aperture 14a, but the present invention is not limited to this. Also, in the first embodiment above, an example is shown in which the first apertures 14b are disposed on the straight line L1 (the first reference line) connecting the pair of notches formed on the pair of sides along the Y direction, and the second apertures 14c are disposed on the straight line L2 (the second reference line) connecting the pair of notches formed on the pair of sides along the X direction, but the present invention is not limited to this. As shown in FIG. 17, the reference position P may be provided in a portion of the reflective sheet 13 other than a portion where the apertures 14 are formed. The first apertures 14b may be disposed along the straight line L1 (the first reference line), instead of on the straight line L1 (the first reference line), such that the first apertures 14b do not overlap with the straight line L1, as shown in FIG. 17. Furthermore, the second apertures 14c may be disposed along the straight line L2 (the second reference line), instead of on the straight line L2 (the second reference line), such that the second apertures 14c do not overlap with the straight line L2, as shown in FIG. 17.

In the first embodiment above, an example is shown in which the reflective sheet 13 has a rectangular shape including four sides in plan view, but the present invention is not limited to this. For example, each part of the light emitting device 10 (the substrate 11, the luminance equalizer sheet 16, the diffusion member 17, the optical sheet 18, the holding member 15) only needs to be formed in a shape corresponding to the shape of the display panel 20, and may be a circular shape, an elliptical shape, a polygonal shape, an irregular shape (e.g., a shape including concave or convex), and the like other than a rectangular shape.

In the first embodiment above, an example is shown in which the holding member 15 has the first engagement protrusions 151 and the second engagement protrusions 152, the substrate 11 has the notches that engage with the first engagement protrusions 151, the reflective sheet 13 has the notches that are the first and second positioning portions that engage with the first engagement protrusions 151, and the luminance equalizer sheet 16 has the notches that engage with the second engagement protrusions 152, but the present invention is not limited to this. As long as the substrate 11, the reflective sheet 13, and the luminance equalizer sheet 16 can be fixed in a state in which they are relatively positioned via the holding member 15, the configuration related to their engagement is not particularly limited.

In the first to sixth embodiments, an example is shown in which for each pair of the light emitting elements 12 and the apertures 14, the first spacing S1 is defined as a spacing between the light emitting element 12 and the farthest part of the aperture 14 from the reference position P on a straight line connecting the reference position P and the farthest part of the aperture 14 from the reference position P, while the second spacing S2 is defined as a spacing between the light emitting element 12 and the nearest part of the aperture 14 from the reference position P on a straight line connecting the reference position P and the nearest part of the aperture 14 from the reference position P, but the present invention is not limited to this. The first spacing S1 and the second spacing S2 can be defined in a different matter for each pair of the light emitting elements 12 and the apertures 14.

Specifically, the first spacing S1 can be defined as a spacing that is located between the light emitting element 12 and the aperture 14 and farther than the light emitting element 12 from the reference position P along a straight line, while the second spacing S2 can be defined as a spacing that is located between the light emitting element 12 and the aperture 14 and closer than the light emitting element 12 to the reference position P along the same straight line. In this case, the straight line can be determined as a straight line passing the reference position P and a point of the light emitting element 12 or the aperture 14, such as the center or centroid of the outer shape of the light emitting element 12, a corner of the outer shape of the light emitting element 12, the center or centroid of the shape of the aperture 14, and the like.

Furthermore, the first spacing S1 can be defined as a spacing that is located between the light emitting element 12 and the aperture 14 and farther than the light emitting element 12 from the straight line L1 along a straight line that is perpendicular to the straight line L1 and passes a point on the light emitting element 12, while the second spacing S2 can be defined as a spacing that is located between the light emitting element 12 and the aperture 14 and closer than the light emitting element 12 to the straight line L1 along the same straight line. Similarly, the first spacing S1 can be defined as a spacing that is located between the light emitting element 12 and the aperture 14 and farther than the light emitting element 12 from the straight line L2 along a straight line that is perpendicular to the straight line L2 and passes a point on the light emitting element 12, while the second spacing S2 can be defined as a spacing that is located between the light emitting element 12 and the aperture 14 and closer than the light emitting element 12 to the straight line L2 along the same straight line.

(1) In view of the state of the known technology and in accordance with one aspect of the present invention, a light emitting device comprises a substrate, a plurality of light emitting elements provided on the substrate, and a reflective sheet provided to be positioned at a predetermined reference position on the substrate and having a plurality of apertures that expose the light emitting elements therethrough, respectively. The apertures are configured such that a first spacing that is located between each of the apertures and a respective one of the light emitting elements and farther than the respective one of the light emitting elements from the reference position is larger than a second spacing that is located between each of the apertures and the respective one of the light emitting elements and closer than the respective one of the light emitting elements to the reference position. For example, the first spacing can be disposed between each of the apertures and the respective one of the light emitting elements and disposed in an opposite direction, which is opposite to an approaching direction approaching the reference position, relative to the respective one of the light emitting elements, while the second spacing can be disposed between each of the apertures and the respective one of the light emitting elements and disposed in the approaching direction approaching the reference position relative to the respective one of the light emitting elements.

(2) In accordance with a preferred embodiment according to the light emitting device mentioned above, the apertures are configured such that the first spacing is dimensioned based on both a reversible expansion and contraction amount caused by expansion and contraction due to a difference in linear expansion coefficients of the substrate and the reflective sheet and a shrinkage amount caused by irreversible shrinkage accumulated over time due to heating of the reflective sheet.

In the light emitting device according to the one aspect, as described above, the first spacing is larger than the second spacing. With this configuration, due to heat shrinkage of the reflective sheet as the light emitting device is used, the first spacing becomes smaller and the second spacing becomes larger. In other words, with the passage of time after the start of use of the light emitting device, due to heat shrinkage of the reflective sheet, the difference between the first spacing and the second spacing becomes smaller until the size of the first spacing and the size of the second spacing become equal to each other. The smaller difference between the first spacing and the second spacing improves the luminance distribution around the light emitting elements, which also improves the luminance uniformity. Even after the size of the first spacing becomes equal to the size of the second spacing through long-term use, luminance uniformity equal to or better than the luminance uniformity at the start of use can be maintained until the size of the second spacing becomes equal to the size of the first spacing at the start of use. This makes it possible to maintain luminance uniformity equal to or better than the luminance uniformity at the start of use for a longer period of time, compared to a light emitting device in which the first spacing and the second spacing are formed to be approximately equal to each other at the start of use and in which luminance uniformity only deteriorates after the start of use. As a result, after long-term use of the light emitting device, a decrease in luminance uniformity due to changes in the relative positions of the light emitting elements and the apertures of the reflective sheet caused by irreversible heat shrinkage of the reflective sheet can be suppressed. The first spacing is dimensioned based on both the reversible expansion and contraction amount caused by expansion and contraction due to the difference in the linear expansion coefficients of the substrate and the reflective sheet, and the shrinkage amount caused by irreversible shrinkage accumulated over time by heating of the reflective sheet. This allows the first spacing of each of the apertures to be set in consideration of both the reversible expansion and contraction amount and the irreversible shrinkage amount. As a result of these, a decrease in luminance uniformity due to changes in the relative positions of the light emitting elements and the apertures of the reflective sheet caused by irreversible heat shrinkage of the reflective sheet can be suppressed after long-term use of the light emitting device, while suppressing the inconvenience caused by the difference in the linear expansion coefficients between the substrate and the reflective sheet. Since the second spacing becomes larger than the second spacing at the start of use due to irreversible shrinkage caused by heating, the second spacing can be formed smaller in advance, compared to a light emitting device in which the first spacing and the second spacing are formed approximately equal to each other at the time of manufacture. By forming the second spacing smaller in advance, the area covered by the reflective sheet on the substrate can be made larger, and thus the luminance of the light emitting device as a whole can be improved.

(3) In accordance with a preferred embodiment according to any one of the light emitting devices mentioned above, the apertures have a polygonal shape having at least a pair of long sides and a pair of short sides, and the apertures are configured such that the first spacing increases as a position of each of the plurality of apertures moving away from the reference position. The further away from the reference position, the larger the relative positional shift between the light emitting elements and the apertures of the reflective sheet caused by the reversible expansion and contraction due to the difference in the linear expansion coefficients of the substrate and the reflective sheet and the irreversible shrinkage accumulated over time by heating of the reflective sheet after long-term use of the light emitting device. Therefore, with the configuration above, the first spacing of each of the apertures can be set in consideration of both the reversible expansion and contraction amount and the irreversible shrinkage amount in the apertures located relatively close to the reference position and the apertures located relatively far from the reference position. With this configuration, it is possible to further suppress the decrease in the luminance uniformity after long-term use of the light emitting device, while suppressing the inconvenience caused by the difference in the linear expansion coefficients between the substrate and the reflective sheet.

(4) In accordance with a preferred embodiment according to any one of the light emitting devices mentioned above, the apertures include a plurality of first apertures that are arranged along a first reference line passing through the reference position and have a rectangular shape, and a plurality of second apertures that are arranged along a second reference line orthogonal to the first reference line and passing through the reference position and have a rectangular shape. With this configuration, even if the apertures have the first apertures and the second apertures that are rectangular in plan view, the difference in luminance distribution around the light emitting elements at the start of use and after long-term use of the light emitting device can be suppressed. As a result, it is possible to suppress the decrease in the luminance uniformity after long-term use of the light emitting device, while suppressing the inconvenience caused by the difference in the linear expansion coefficients between the substrate and the reflective sheet.

(5) In accordance with a preferred embodiment according to any one of the light emitting devices mentioned above, the light emitting elements have a rectangular shape, and have a pair of long sides that are substantially parallel to a pair of long sides of the first apertures and a pair of long sides of the second apertures. Here, in the first apertures and the second apertures, an orthogonal spacing that is disposed between each of the apertures and the respective one of the light emitting elements and disposed in a direction orthogonal to a direction of irreversible shrinkage of the reflective sheet relative to the respective one of the light emitting elements is less affected by shrinkage due to heating than the second spacing. Here, the direction of irreversible shrinkage of the reflective sheet is the approaching direction approaching the reference position. Therefore, by reducing the width of the orthogonal spacing, the area covered by the reflective sheet on the substrate can be increased. Therefore, with the above configuration, a spacing less affected by the shrinkage due to heating among spacings between the apertures and the light emitting elements can be made smaller in advance by matching the direction of the pair of long side and the direction of the pair of short side of the first apertures and the second apertures with the direction of the pair of long sides and the direction of the pair of short side of the light emitting elements. As a result, the area covered by the reflective sheet on the substrate can be enlarged, and thus the luminance of the light emitting device as a whole can be further improved.

(6) In accordance with a preferred embodiment according to any one of the light emitting devices mentioned above, the apertures further include a third aperture that is arranged in an area other than areas along the first reference line and the second reference line.

(7) In accordance with a preferred embodiment according to any one of the light emitting devices mentioned above, the third aperture has a pair of inclined sides inclined to the first reference line and the second reference line. Here, in the third aperture, an orthogonal spacing that is disposed between the third aperture and the light emitting element and disposed in a direction orthogonal to a direction of irreversible shrinkage of the reflective sheet relative to the light emitting element is less affected by shrinkage due to heating than the second spacing. Here, the direction of irreversible shrinkage of the reflective sheet is the approaching direction approaching the reference position. Therefore, by reducing the width of the orthogonal spacing, even in the third aperture, the area covered by the reflective sheet on the substrate can be increased. Therefore, with the above configuration, even in the third aperture, the orthogonal spacing less affected by the shrinkage due to heating among spacings between the third aperture and the light emitting element can be made smaller in advance. As a result, the area covered by the reflective sheet on the substrate can be enlarged, and thus the luminance of the light emitting device as a whole can be further improved.

(8) In accordance with a preferred embodiment according to any one of the light emitting devices mentioned above, the light emitting elements have a rectangular shape, and have a pair of long sides that are substantially parallel to the pair of inclined sides of the third aperture. Here, in the third aperture, an orthogonal spacing between the third aperture and the light emitting element and disposed in a direction orthogonal to a direction of irreversible shrinkage of the reflective sheet relative to the light emitting element is less affected by shrinkage due to heating than the second spacing. Here the direction of irreversible shrinkage of the reflective sheet is the approaching direction approaching the reference position. Therefore, by reducing the width of the orthogonal spacing, in the third aperture, the area covered by the reflective sheet on the substrate can be increased. Therefore, with the above configuration, by matching the direction in which the pair of inclined sides in the third aperture extends with the direction of the pair of long sides in the light emitting elements, the orthogonal spacing less affected by the shrinkage due to heating among spacings between the third aperture and the light emitting element can be made smaller in advance. As a result, the area covered by the reflective sheet on the substrate can be enlarged, and thus the luminance of the light emitting device as a whole can be further improved.

(9) In accordance with a preferred embodiment according to any one of the light emitting devices mentioned above, the reference position is located at an intersection of a straight line connecting a pair of first positioning portions for positioning the reflective sheet and a straight line connecting a pair of second positioning portions for positioning the reflective sheet, which are different from the pair of first positioning portions. With this configuration, the substrate and the reflective sheet can be easily positioned at the reference position, and thus the workability of assembling the reflective sheet can be improved.

(10) In accordance with a preferred embodiment according to any one of the light emitting devices mentioned above, the apertures includes a reference aperture, the reference position being located at a center of the reference aperture. With this configuration, the substrate and the reflective sheet can be positioned more easily at the reference position provided at the center of the reference aperture, and thus the workability of assembling the reflective sheet can be further improved.

(11) In accordance with a preferred embodiment according to any one of the light emitting devices mentioned above, the apertures are configured such that the first spacing is larger than a spacing that is disposed between each of the apertures and the respective one of the light emitting elements and disposed in a direction orthogonal to an approaching direction approaching the reference position relative to the respective one of the light emitting elements. With this configuration, a spacing less affected by the shrinkage due to heating among spacings between the apertures and the light emitting elements can be made smaller in advance, and a decrease in luminance uniformity due to changes in the relative positions of the light emitting elements and the apertures of the reflective sheet caused by irreversible heat shrinkage of the reflective sheet can be suppressed after long-term use of the light emitting device.

(12) In accordance with a preferred embodiment according to any one of the light emitting devices mentioned above, the apertures are configured such that an area of the apertures increases as a position of each of the apertures moving away from the reference position. With this configuration, the area or aperture area of the apertures can be set in consideration of the reversible expansion and contraction amount caused by expansion and contraction due to the difference in the linear expansion coefficients of the substrate and the reflective sheet, and the shrinkage amount caused by irreversible shrinkage accumulated over time by heating of the reflective sheet in the apertures located relatively close to the reference position and the apertures located relatively far from the reference position. With this configuration, it is possible to further suppress the decrease in the luminance uniformity after long-term use of the light emitting device.

(13) In accordance with a preferred embodiment according to any one of the light emitting devices mentioned above, the apertures are configured such that the second spacing is smaller than the first spacing at start of use of the light emitting device.

(14) In accordance with a preferred embodiment according to any one of the light emitting devices mentioned above, the apertures are configured such that the second spacing is larger than the first spacing at a time when a preset usage time of the light emitting device is reached.

(15) In accordance with a preferred embodiment according to any one of the light emitting devices mentioned above, the apertures are configured such that the second spacing at the time when the preset usage time of the light emitting device is reached is approximately equal to the first spacing at the start of use of the light emitting device.

Thus, for example, the apertures are configured such that a status in which the second spacing is smaller than the first spacing at start of use of the light emitting deice is reversed so as to be a state in which the second spacing is larger than the first spacing at a time when a preset usage time of the light emitting device is reached, and such that the second spacing at the time when the preset usage time of the light emitting device is reached is approximately equal to the size of the first spacing at the start of use of the light emitting device. With this configuration, a difference between the difference between the first spacing and the second spacing at the start of use of the light emitting device and the difference between the first spacing and the second spacing at the time when the preset usage time of the light emitting device is reached can be eliminated. Therefore, the luminance uniformity at the start of use of the light emitting device and at the time when the preset usage time is reached can be made equal to each other.

(16) In accordance with a preferred embodiment according to any one of the light emitting devices mentioned above, the apertures are configured such that a center of each of the apertures is offset relative to a center of the respective one of the light emitting elements.

(17) In accordance with a preferred embodiment according to any one of the light emitting devices mentioned above, the apertures are configured such that the respective one of the light emitting elements is disposed closer to the reference position than a center of each of the apertures at start of use of the light emitting device.

(18) In accordance with a preferred embodiment according to any one of the light emitting devices mentioned above, the apertures are configured such that the respective one of the light emitting elements is disposed farther from the reference position than a center of each of the apertures when a preset usage time of the light emitting device is reached.

(19) In accordance with a preferred embodiment according to any one of the light emitting devices mentioned above, the third aperture has a pair of inclined sides that extend in radial directions relative to the reference position.

(20) In accordance with a preferred embodiment according to any one of the light emitting devices mentioned above, the light emitting elements have a rectangular shape, and have a pair of long sides that are inclined relative to the pair of inclined sides of the third aperture.

With the present invention, as described above, a light emitting device can be provided that can suppress the decrease in the luminance uniformity due to the change in the relative position between the light emitting elements and the apertures of the reflective sheet caused by irreversible heat shrinkage of the reflective sheet after long-term use of the light emitting device, while suppressing the inconvenience caused by the difference in the linear expansion coefficients between the substrate and the reflective sheet.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

As used herein, the following directional terms "forward", "rearward", "front", "rear", "up", "down", "above", "below", "upward", "downward", "top", "bottom", "side", "vertical", "horizontal", "perpendicular" and "transverse" as well as any other similar directional terms refer to those directions of a display device and a light emitting device in an upright position. Accordingly, these directional terms, as utilized to describe the display device should be interpreted relative to a display device and a light emitting device in an upright position. The terms "left" and "right" are used to indicate the "right" when referencing from the right side as viewed from the front surface of the display device, and the "left" when referencing from the left side as viewed from the front surface of the display device.

Also it will be understood that although the terms "first" and "second" may be used herein to describe various components these components should not be limited by these terms. These terms are only used to distinguish one component from another. Thus, for example, a first component discussed above could be termed a second component and vice-a-versa without departing from the teachings of the present invention. The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A light emitting device comprising:
a substrate;
a plurality of light emitting elements arranged on the substrate relative to each other in a first direction of the substrate and in a second direction of the substrate that is orthogonal to the first direction; and
a reflective sheet provided to be positioned at a predetermined reference position on the substrate and having a plurality of apertures that expose the light emitting elements therethrough, respectively,
the apertures being configured such that a first spacing that is located between each of the apertures and a respective one of the light emitting elements and farther than the respective one of the light emitting elements from the reference position is larger than a second spacing that is located between each of the apertures and the respective one of the light emitting elements and closer than the respective one of the light emitting elements to the reference position, the apertures including an inclined aperture that has a plurality of sides with an inclined side that is inclined relative to the first direction and the second direction, and the light emitting elements having a rectangular shape, and having a pair of long sides that are substantially parallel to one of the sides of the inclined aperture.

2. The light emitting device according to claim 1, wherein the apertures are configured such that the first spacing is dimensioned based on both a reversible expansion and contraction amount caused by expansion and contraction due to a difference in linear expansion coefficients of the substrate and the reflective sheet and a shrinkage amount caused by irreversible shrinkage accumulated over time due to heating of the reflective sheet.

3. The light emitting device according to claim 1, wherein the apertures have a polygonal shape having at least a pair of long sides and a pair of short sides, and the apertures are configured such that the first spacing increases as a position of each of the apertures moving away from the reference position.

4. The light emitting device according to claim 1, wherein the apertures include a plurality of first apertures that are arranged along a first reference line passing through the reference position and have a rectangular shape, and a plurality of second apertures that are arranged along a second reference line orthogonal to the first reference line and passing through the reference position and have a rectangular shape.

5. The light emitting device according to claim 4, wherein the long sides of the light emitting elements are substantially parallel to a pair of long sides of the first apertures and a pair of long sides of the second apertures.

6. The light emitting device according to claim 4, wherein the inclined aperture is arranged in an area other than areas along the first reference line and the second reference line.

7. The light emitting device according to claim 6, wherein the inclined side of the inclined aperture is inclined to the first reference line and the second reference line.

8. The light emitting device according to claim 1, wherein the reference position is located at an intersection of a straight line connecting a pair of first positioning portions for positioning the reflective sheet and a straight line connecting a pair of second positioning portions for positioning the reflective sheet, which are different from the pair of first positioning portions.

9. The light emitting device according to claim 1, wherein the reflective sheet further has a reference aperture that is different from the apertures, the reference position being located at a center of the reference aperture.

10. The light emitting device according to claim 1, wherein the apertures are configured such that the first spacing is larger than a spacing that is disposed between each of the apertures and the respective one of the light emitting elements and disposed in a direction orthogonal to an approaching direction approaching the reference position relative to the respective one of the light emitting elements.

11. The light emitting device according to claim 1, wherein the apertures are configured such that an area of the apertures increases as a position of each of the apertures moving away from the reference position.

12. The light emitting device according to claim 1, wherein the apertures are configured such that the second spacing is smaller than the first spacing at start of use of the light emitting device.

13. The light emitting device according to claim 1, wherein the apertures are configured such that a center of each of the apertures is offset relative to a center of the respective one of the light emitting elements.

14. The light emitting device according to claim 1, wherein the inclined side of the inclined aperture extends in radial directions relative to the reference position.

15. A light emitting device comprising:
a substrate;
a plurality of light emitting elements provided on the substrate; and
a reflective sheet provided to be positioned at a predetermined reference position on the substrate and having a plurality of apertures that expose the light emitting elements therethrough, respectively,
the apertures being configured such that a first spacing that is located between each of the apertures and a respective one of the light emitting elements and farther than the respective one of the light emitting elements from the reference position is larger than a second spacing that is located between each of the apertures and the respective one of the light emitting elements and closer than the respective one of the light emitting elements to the reference position,
the apertures including
a plurality of first apertures that are arranged along a first reference line passing through the reference position and have a rectangular shape,
a plurality of second apertures that are arranged along a second reference line orthogonal to the first reference line and passing through the reference position and have a rectangular shape, and
a third aperture that is arranged in an area other than areas along the first reference line and the second reference line and has a pair of inclined sides inclined to the first reference line and the second reference line,
the light emitting elements having a rectangular shape, and having a pair of long sides that are substantially parallel to the pair of inclined sides of the third aperture.

16. A light emitting device comprising:
a substrate;
a plurality of light emitting elements provided on the substrate; and
a reflective sheet provided to be positioned at a predetermined reference position on the substrate and having a plurality of apertures that expose the light emitting elements therethrough, respectively,
the apertures being configured such that a first spacing is larger than a second spacing at start of use of the light emitting device, the first spacing being located between each of the apertures and a respective one of the light emitting elements and farther than the respective one of the light emitting elements from the reference position, the second spacing being located between each of the apertures and the respective one of the light emitting elements and closer than the respective one of the light emitting elements to the reference position, and the apertures being configured such that the first spacing is smaller than the second spacing at a time when a preset usage time of the light emitting device is reached.

17. The light emitting device according to claim 16, wherein the apertures are configured such that the second spacing at the time when the preset usage time of the light emitting device is reached is approximately equal to the first spacing at the start of use of the light emitting device.

18. The light emitting device according to claim 16, wherein the apertures are configured such that the respective one of the light emitting elements is closer to the reference position than a center of each of the apertures is to the reference position at the start of use of the light emitting device.

19. The light emitting device according to claim 16, wherein the apertures are configured such that the respective one of the light emitting elements is farther from the reference position than a center of each of the apertures is from the reference position when the preset usage time of the light emitting device is reached.

20. A light emitting device comprising:

a substrate;

a plurality of light emitting elements provided on the substrate; and a reflective sheet provided to be positioned at a predetermined reference position on the substrate and having a plurality of apertures that expose the light emitting elements therethrough, respectively, the apertures being configured such that a first spacing that is located between each of the apertures and a respective one of the light emitting elements and farther than the respective one of the light emitting elements from the reference position is larger than a second spacing that is located between each of the apertures and the respective one of the light emitting elements and closer than the respective one of the light emitting elements to the reference position, the apertures including
 a plurality of first apertures that are arranged along a first reference line passing through the reference position and have a rectangular shape,
 a plurality of second apertures that are arranged along a second reference line orthogonal to the first reference line and passing through the reference position and have a rectangular shape, and
 a third aperture that is arranged in an area other than areas along the first reference line and the second reference line and has a pair of inclined sides inclined to the first reference line and the second reference line, the light emitting elements having a rectangular shape, and having a pair of long sides that are inclined relative to the pair of inclined sides of the third aperture.

* * * * *